(12) United States Patent
Oh et al.

(10) Patent No.: US 11,169,320 B2
(45) Date of Patent: Nov. 9, 2021

(54) LIGHT SOURCE MEMBER AND DISPLAY DEVICE HAVING THE SAME

(71) Applicant: Samsung Display Co., Ltd., Yongin-si (KR)

(72) Inventors: Min Jeong Oh, Gimpo-si (KR); Kwang Soo Bae, Yongin-si (KR); Beom Soo Park, Hwaseong-si (KR); Young Je Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 5 days.

(21) Appl. No.: 16/735,656

(22) Filed: Jan. 6, 2020

(65) Prior Publication Data

US 2020/0400874 A1 Dec. 24, 2020

(30) Foreign Application Priority Data

Jun. 20, 2019 (KR) .................. 10-2019-0073416

(51) Int. Cl.
*F21V 8/00* (2006.01)
*H01L 33/50* (2010.01)
*F21K 9/64* (2016.01)
*H05K 7/20* (2006.01)

(52) U.S. Cl.
CPC .............. *G02B 6/0085* (2013.01); *F21K 9/64* (2016.08); *H01L 33/502* (2013.01); *H01L 33/507* (2013.01); *H05K 7/20963* (2013.01)

(58) Field of Classification Search
CPC ... G02B 6/0085; H01L 33/507; H01L 33/502; F21K 9/64; H05K 5/20963
See application file for complete search history.

(56) References Cited

U.S. PATENT DOCUMENTS

| 7,903,055 B2 * | 3/2011 | Nishikawa | H05B 33/22 345/77 |
|---|---|---|---|
| 10,150,912 B2 | 12/2018 | Choi et al. | |
| 2005/0142678 A1 * | 6/2005 | Kim | G02F 1/133553 438/30 |
| 2015/0370004 A1 * | 12/2015 | Fu | G02B 6/0085 362/612 |
| 2018/0101063 A1 | 4/2018 | Chang | |

FOREIGN PATENT DOCUMENTS

| KR | 10-2016-0074745 | 6/2016 |
|---|---|---|
| KR | 10-2018-0127246 | 11/2018 |

\* cited by examiner

*Primary Examiner* — William J Carter
(74) *Attorney, Agent, or Firm* — Kile Park Reed & Houtteman PLLC

(57) ABSTRACT

A light source member including a substrate, and a plurality of unit light source cells disposed on the substrate and arranged in a matrix, each of the unit light source cells including a light source driving electrode disposed on the substrate, a light source disposed on the substrate and electrically connected to the light source driving electrode, an organic layer disposed on the substrate and exposing the light source and at least a part of the light source driving electrode, the organic layer having an upper surface including a concavo-convex pattern, and a heat dissipation layer disposed on the organic layer and contacting the light source driving electrode.

21 Claims, 14 Drawing Sheets

110a : 113, 114, 115, 116, 117a, 117b, 118
120 : 121, 122, 123, 124, 125, 126

110a : 113, 114, 115, 116, 117a, 117b, 118
120 : 121, 122, 123, 124, 125, 126

110a : 113, 114, 115, 116, 117a, 117b, 118
120 : 121, 122, 123, 124, 125, 126
130_8 : 131, 132

110a : 113, 114, 115, 116, 117a, 117b, 118
120 : 121, 122, 123, 124, 125, 126
130_9 : 131, 132_9

110a : 113, 114, 115, 116, 117a, 117b, 118
120 : 121, 122, 123, 124, 125, 126
130_10 : 131_10, 132_10

110a : 113, 114, 115, 116, 117a, 117b, 118
120 : 121, 122, 123, 124, 125, 126
130_11 : 131_10, 132_11

110a : 113, 114, 115, 116, 117a, 117b, 118
120 : 121, 122, 123, 124, 125, 126
130_12 : 131_10, 132_12

110a : 113, 114, 115, 116, 117a, 117b, 118
120 : 121, 122, 123, 124, 125, 126
130_13 : 131_13, 132_13

110a : 113, 114, 115, 116, 117a, 117b, 118
120 : 121, 122, 123, 124, 125, 126

LIGHT SOURCE MEMBER AND DISPLAY DEVICE HAVING THE SAME

CROSS-REFERENCE TO RELATED APPLICATION

This application claims priority from and the benefit of Korean Patent Application No. 10-2019-0073416, filed on Jun. 20, 2019, which is hereby incorporated by reference for all purposes as if fully set forth herein.

BACKGROUND

Field

Exemplary embodiments of the invention relate generally to a light source member and a display device having the same.

Discussion of the Background

A liquid-crystal display device receives light from a backlight unit, and displays an image. The backlight unit includes a light source member including a plurality of light sources. Light emitted from the light sources is incident on a liquid-crystal display panel via an optical film or the like.

As the substrate, on which the light sources are disposed, a glass substrate may be employed to reduce the material cost. When the backlight unit includes a glass substrate and light sources, the glass substrate may further include a circuit element layer. As the circuit element layer and the light sources are driven, heat is generated. The glass substrate has low thermal conductivity, and thus, the heat generated cannot be easily discharged.

The above information disclosed in this Background section is only for understanding of the background of the inventive concepts, and, therefore, it may contain information that does not constitute prior art.

SUMMARY

Light source members constructed according to exemplary embodiments of the invention and display devices including the same are capable of improving the efficiency of discharging heat generated in light sources.

Additional features of the inventive concepts will be set forth in the description which follows, and in part will be apparent from the description, or may be learned by practice of the inventive concepts.

A light source member according to an exemplary embodiment includes a substrate, and a plurality of unit light source cells disposed on the substrate and arranged in a matrix, each of the unit light source cells including a light source driving electrode disposed on the substrate, a light source disposed on the substrate and electrically connected to the light source driving electrode, an organic layer disposed on the substrate and exposing the light source and at least a part of the light source driving electrode, the organic layer having an upper surface including a concavo-convex pattern, and a heat dissipation layer disposed on the organic layer and contacting the light source driving electrode.

The heat dissipation layer may be conformally disposed on the upper surface of the organic layer having the surface concavo-convex pattern.

The heat dissipation layer may include at least one of silver (Ag), copper (Cu), aluminum (Al), molybdenum (Mo), and indium tin oxide (ITO), or an alloy thereof.

The heat dissipation layer may surround the light source.

The heat dissipation layer may be spaced apart from the light source and be electrically connected to the light source through the light source driving electrode.

The heat dissipation layer may be spaced apart from a heat dissipation layer of an adjacent unit light source cell.

The substrate may include glass.

A light source member according to another exemplary embodiment includes a substrate, a circuit element layer disposed on the substrate and including a light source driving electrode, a light source disposed on the circuit element layer and electrically connected to the light source driving electrode, a first insulating layer disposed on the circuit element layer and exposing the light source and at least a part of the light source driving electrode, a first heat dissipation layer disposed on the first insulating layer and contacting the light source driving electrode, a second insulating layer disposed on the first heat dissipation layer, and a second heat dissipation layer disposed on the second insulating layer and contacting at least one of the light source driving electrode and the first heat dissipation layer.

The first insulating layer may include an organic material, and an upper surface of the first insulating layer may include a first surface concavo-convex pattern.

The first heat dissipation layer may be conformally disposed on the upper surface of the first insulating layer having the first surface concavo-convex pattern to include a second surface concavo-convex pattern on one surface thereof.

The second insulating layer may be conformally disposed on the first heat dissipation layer to include a third surface concavo-convex pattern on one surface thereof, and the second heat dissipation layer may be conformally disposed on the second insulating layer to include a fourth surface concavo-convex pattern on one surface thereof.

A surface of the second heat dissipation layer may be substantially flat.

Each of the first heat dissipation layer and the second heat dissipation layer may include at least one of silver (Ag), copper (Cu), aluminum (Al), molybdenum (Mo), and indium tin oxide (ITO), or an alloy thereof.

The first heat dissipation layer may be spaced apart from the light source and be electrically connected to the light source through the light source driving electrode.

The second insulating layer may include at least one contact hole penetrating through the second insulating layer, and the first heat dissipation layer and the second heat dissipation layer may contact each other through the contact hole.

The light source member may include a plurality of unit light source cells arranged in a matrix, and each of the unit light source cells may include the light source, the first insulating layer, the first heat dissipation layer, the second insulating layer, and the second heat dissipation layer.

The first heat dissipation layer may be spaced apart from a first heat dissipation layer of an adjacent unit light source cell, and the second heat dissipation layer may be spaced apart from a second heat dissipation layer of the adjacent unit light source cell.

A display device according to yet another exemplary embodiment includes a light source member including a substrate and a plurality of unit light source cells arranged on the substrate in a matrix, and a display panel disposed on the light source member, in which each of the unit light source cells includes a circuit element layer disposed on the substrate and including a light source driving electrode, a light source disposed on the circuit element layer and electrically connected to the light source driving electrode, an organic layer disposed on the circuit element layer and exposing the light source and at least a part of the light source driving electrode, the organic layer having an upper surface including a first surface concavo-convex pattern, a first heat dissipation layer disposed on the organic layer and contacting the light source driving electrode, an insulating layer disposed on the first heat dissipation layer, and a second heat dissipation layer disposed on the insulating layer and contacting at least one of the light source driving electrode and the first heat dissipation layer.

The first heat dissipation layer may be conformally disposed on the organic layer to include a second surface concavo-convex pattern on one surface thereof, the insulating layer may be conformally disposed on the first heat dissipation layer to include a third surface concavo-convex pattern on one surface thereof, and the second heat dissipation layer may be conformally disposed on the insulating layer to include a fourth surface concavo-convex pattern on one surface thereof.

Each of the first heat dissipation layer and the second heat dissipation layer may include at least one of silver (Ag), copper (Cu), aluminum (Al), molybdenum (Mo), and indium tin oxide (ITO), or an alloy thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
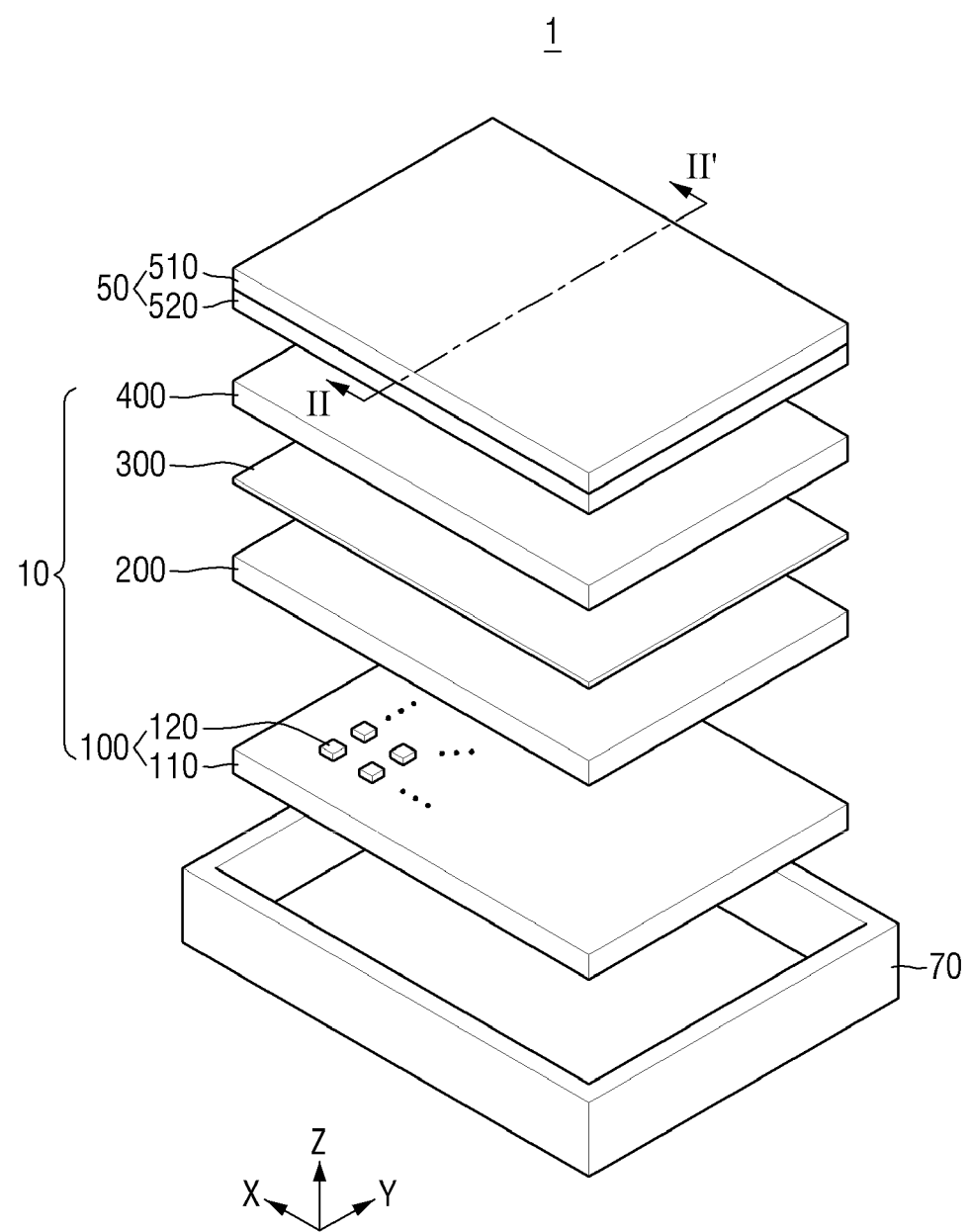
FIG. 1 is an exploded, perspective view of a display device according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
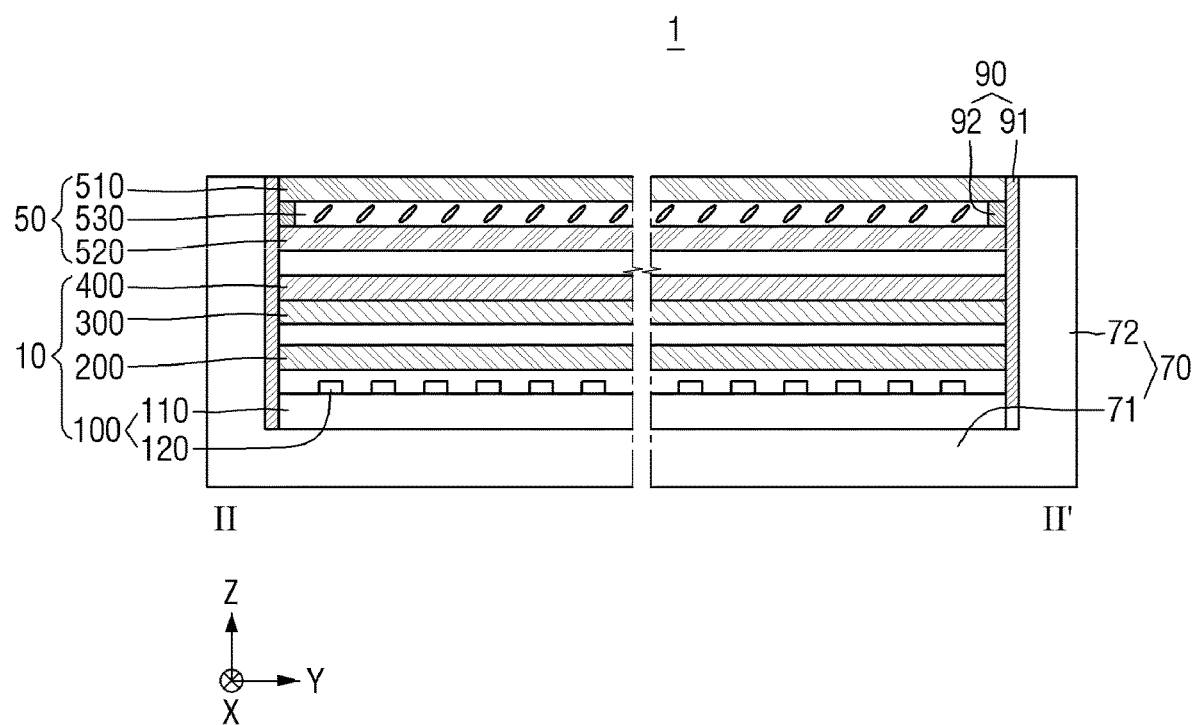
FIG. 2 is a cross-sectional view taken along line II-II' of FIG. 1.

FIG. 1 is an exploded, perspective view of a display device according to an exemplary embodiment of the present disclosure. FIG. 2 is a cross-sectional view taken along line II-II' of FIG. 1.

Referring to FIGS. 1 and 2, a display device 1 may display an image or video, and may be employed in a variety of electronic devices, such as a television, an electric billboard, a monitor, a personal computer, a laptop computer, a tablet PC, a smartphone, a vehicle navigation unit, a camera, a center information display (CID) installed in vehicles, a wrist-type electronic device, a personal digital assistant (PDA), a portable multimedia player (PMP), and a game machine, without being limited thereto.

In the drawings, a first direction X, a second direction Y, and a third direction Z are defined. The first direction X may be perpendicular to the second direction Y in a plane. The third direction Z may be perpendicular to a plane defined by the first direction X and the second direction Y. The third direction Z may be perpendicular to each of the first direction X and the second direction Y. In the following description, the third direction Z may refer to a thickness direction of the display device 1.

In the following description, unless specifically stated otherwise, the upper portion or the upper side refers to the portion or side of the display device 1 indicated by the arrow in the third direction Z, e.g., the upper side in the thickness direction in the drawings. Likewise, the upper surface refers to a surface disposed on a side indicated by the arrow in the third direction Z. In addition, the lower portion or the lower side refers to the opposite portion or side of the display device 1 in the third direction Z, e.g., the lower side in the thickness direction in the drawings. Likewise, the lower surface refers to a surface opposite to the third direction Z.

The display device 1 may have substantially a rectangular shape including longer sides in the first direction X and shorter sides in the second direction Y when viewed from the top. The corners where the longer sides and the shorter sides of the display device 1 meet may form a right angle. However, the inventive concepts are not limited thereto, and in some exemplary embodiments, the display device 1 may have rounded corners. The shape of the display device 1 when viewed from the top is not limited to that shown in the drawings. For example, in some exemplary embodiments, the display device 1 may have substantially a square shape, a circular shape, an elliptical shape, or other shapes. A display surface may be located on one side of the display device 1 in the third direction Z, e.g., the thickness direction.

The display device 1 may include a display panel 50, a backlight unit 10 disposed under the display panel 50 to provide light to the display panel 50, a housing 70 accommodating the display panel 50, and the backlight unit 10. However, the inventive concepts are not limited thereto, and in some exemplary embodiments, at least one or more of the above-described members may be omitted from or additional member may be added to the display device 1.

The display panel 50 may receive light emitted from the backlight unit 10 to display image. In an exemplary embodiment, the display panel 50 may be a light-receiving display panel. For example, the display panel 50 may be a liquid-crystal display panel, an electrowetting display panel, an electrophoretic display panel, etc. Hereinafter, the display panel 50 will be described with reference to a liquid-crystal panel (LCD), however, the inventive concepts are not limited to one particular type of the display panel 50. For example, in some exemplary embodiments, the display panel 50 may be other types of panel.

The display panel 50 includes a plurality of pixels. The pixels of the display panel 50 may be arranged in a matrix. The display panel 50 may include switching elements and pixel electrodes each disposed in the respective pixels, and a common electrode facing the pixel electrodes.

As shown in FIG. 2, the display panel 50 may include a top substrate 510, a bottom substrate 520 opposing the top substrate 510, and a liquid-crystal layer 530 disposed therebetween. The switching element and the pixel electrode may be disposed on the bottom substrate 520, and the common electrode may be disposed on the top substrate 510. In some exemplary embodiments, however, the common electrode may also be disposed on the bottom substrate 520 along with the switching element and the pixel electrode. A sealing member 92 may be disposed along the edges of the top substrate 510 and the bottom substrate 520 to confine liquid-crystal molecules of the liquid-crystal layer 530.

The backlight unit 10 is disposed under the display panel 50. The backlight unit includes a light source member 100, a wavelength conversion layer 200, a diffusion plate 300, and an optical film 400.

The light source member 100 may include a substrate 110 and a plurality of light sources 120 disposed on the substrate 110. The light sources 120 emit light towards the display panel 50. Light emitted from the light sources 120 may be incident on the wavelength conversion layer 200 disposed thereabove.

The light source member 100 will be described in more detail below.

The wavelength conversion layer 200 may be disposed above and overlap the light source member 100. The wavelength conversion layer 200 may be disposed over substantially the entire surface of the light source member 100, or may be disposed on each of the light sources 120 and surround the light sources 120. The wavelength conversion layer 200 converts the wavelength of at least a part of incident light. In an exemplary embodiment, the wavelength conversion layer 200 may be in the form of a film, and may be disposed above the light source member 100 to be spaced apart from the light source member 100 in the third direction Z.

The wavelength conversion layer 200 may include a binder layer and wavelength conversion particles dispersed in the binder layer. The wavelength conversion layer 200 may further include scattering particles dispersed in the binder layer in addition to the wavelength conversion particles.

The binder layer is a medium, in which the wavelength conversion particles are dispersed, and may be made of various resin compositions. However, the inventive concepts are not limited thereto. For example, any medium can be formed as the binder layer regardless of its name, other additional functionality, and its composition materials, as long as the wavelength conversion particles and/or the scattering particles can be dispersed therein.

The wavelength conversion particles may convert the wavelength of incident light, and may be, for example, quantum dots (QD), a fluorescent material, or a phosphorescent material. Hereinafter, the wavelength-converting particles will be described with reference to quantum-dots, however, the inventive concepts are not limited thereto.

A quantum dot is a material having a crystal structure of several nanometers in size, and consists of hundreds to thousands of atoms. The quantum dot exhibits the quantum confinement effect, which leads to an increase in the energy band gap due to its small size. When light of a wavelength having an energy level higher than the bandgap is incident on a quantum dot (QD), the quantum dot may be excited by absorbing light, which then emits light of a particular wavelength when reverting to the ground state. The wavelength of emitted light has a value corresponding to the band gap. In this manner, by adjusting the size and composition of the quantum dots (QD), the luminescence characteristics due to the quantum confinement effect can be adjusted.

A quantum dot may include, for example, at least one of a group II-VI compound, a group II-V compound, a group III-VI compound, a group III-V compound, a group IV-VI compound, a group I-III-VI compound, a group II-IV-VI compound, and a group II-IV-V compound.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The wavelength conversion particles may include a number of wavelength conversion particles that convert incident light into light of different wavelengths. For example, the wavelength conversion particles may include first wavelength conversion particles that convert incident light of a specific wavelength into a first wavelength, and second wavelength conversion particles that convert the incident light into a second wavelength. In an exemplary embodiment, light emitted from the light sources 120 and incident on the wavelength conversion particle may be blue light, the first wavelength may be a wavelength corresponding to green, and the second wavelength may be a wavelength corresponding to red. For example, the blue wavelength may have a peak at 420 nm to 470 nm, the green wavelength may have a peak at 520 nm to 570 nm, and the red wavelength may have a peak at 620 nm to 670 nm, without being limited thereto.

The diffusion plate 300 may be disposed on the wavelength conversion layer 200. The diffusion plate 300 may be spaced apart from the wavelength conversion layer 200 in the third direction Z. The diffusion plate 300 diffuses light exiting from the wavelength conversion layer 200 toward the display panel 50, so that light emitted from the light source 120 can be provided to the display panel 50 with more uniform brightness.

The diffusion plate 300 may include a light-transmitting material. The diffusion plate 300 may include, for example, polymethyl methacrylate (PMMA), polystyrene (PS), polypropylene (PP), polyethylene terephthalate (PET), polycarbonate (PC), etc, without being limited thereto.

The optical film 400 may be disposed on the diffusion plate 300. The display device 1 may include at least one optical film 400, and the number of the optical film 400 is not particularly limited herein. Although the optical film 400 is illustrated as being disposed to be spaced apart from the diffusion plate 300 and the display panel 50 in the third direction Z, however, in some exemplary embodiments, the optical film 400 may be in contact with at least one of the diffusion plate 300 and the display panel 50.

The optical film 400 may perform optical functions, e.g., such as concentrating, refracting, diffusing, reflecting, polarizing, or retarding incident light. The optical film 400 may include a prism film, a micro-lens film, a lenticular film, a polarizing film, a reflective polarizing film, a retardation film, a protective film, etc. The display device 1 may further include a plurality of optical films 400 of the same type or different types. When a plurality of optical films 400 is employed, the optical films 400 may overlap each other or may be spaced apart from each other. In some exemplary embodiments, the optical film 400 may be implemented as a complex layer by integrally stacking multiple layers having various optical functions.

The housing 70 accommodates the backlight unit 10 and the display panel 50. The housing 70 may include a bottom chassis or a bracket, and a top chassis.

The housing 70 may include a bottom 71 and side walls 72. The side walls 72 of the housing 70 may be connected to the bottom 71, and may be bent therefrom in the vertical direction. The light source member 100 of the backlight unit 10 is disposed on the bottom 71 of the housing 70. The diffusion plate 300 and the optical film 400 of the backlight unit 10 and the display panel 50 may be fixed to the side walls 72 of the housing 70 by an adhesive tape 91. However, the inventive concepts are not limited thereto. For example, in some exemplary embodiments, the members may be mounted on another mounting structure of the housing 70 or may be mounted or attached on a mold frame disposed in the housing 70.

Hereinafter, the light source member 100 of the backlight unit 10 will be described in detail.

Figure 3:
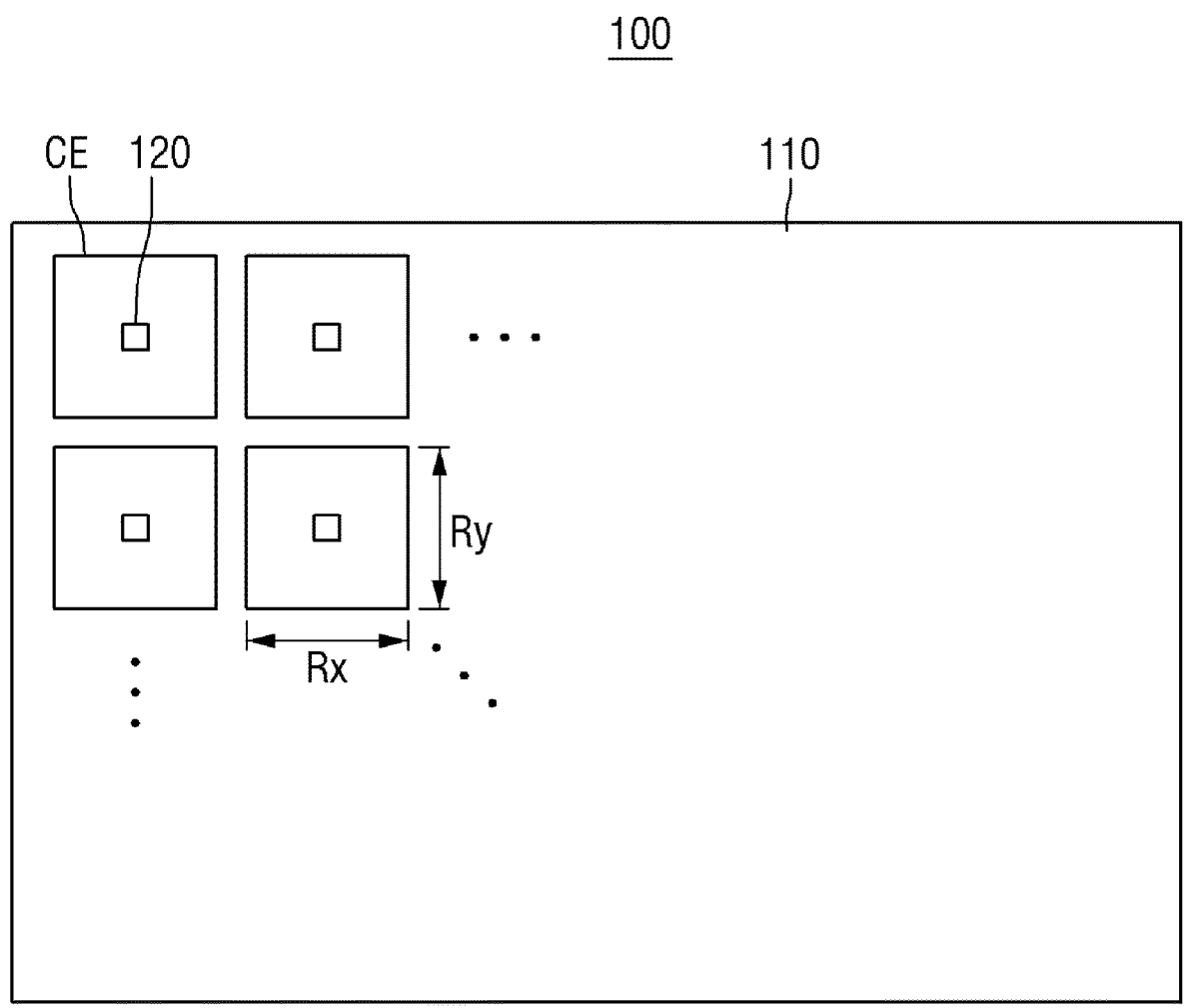
FIG. 3 is a plan view of a light source member according to an exemplary embodiment.
Figure 4:
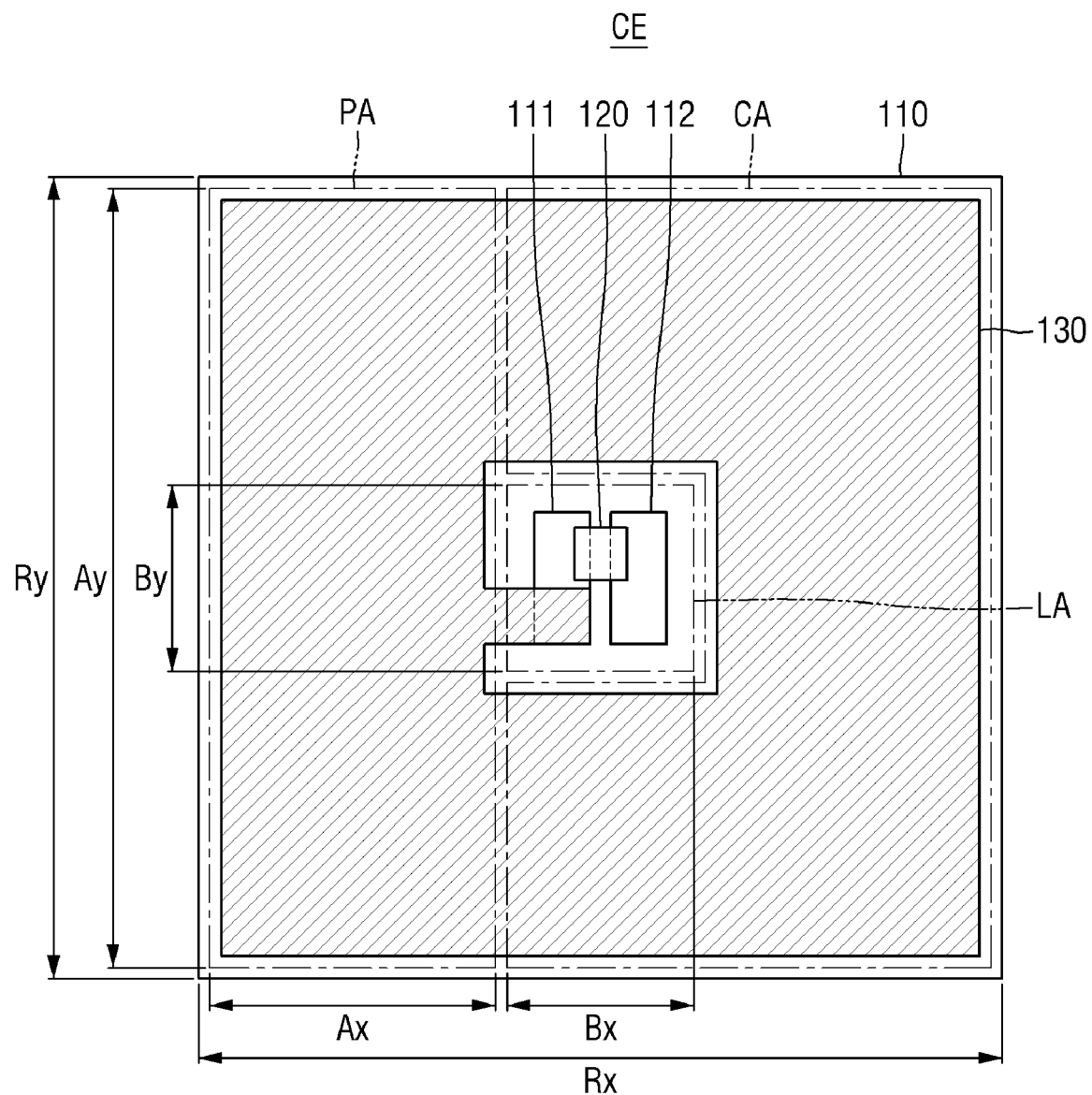
FIG. 4 is an enlarged plan view of a portion of FIG. 3, where a single light source cell is disposed.

FIG. 3 is a plan view of a light source member according to an exemplary embodiment. FIG. 4 is an enlarged plan view of a portion of FIG. 3, where a single light source cell is disposed.

Referring to FIGS. 3 and 4, the light source member 100 may include a substrate 110 as a base substrate, and may further include a circuit element layer and a plurality of light sources disposed on the substrate 110. The light source member 100 may be divided into various regions, cells, etc. depending on the arrangement of the circuit element layer and the light sources disposed on the substrate 110.

More particularly, the light source member 100 may include a plurality of light source cells CE in a plan view. The light source cells CE may be defined as a basic unit that receives an electric signal from the circuit element layer and drives the light sources 120 to emit light. Each of the light source cells CE may include at least one light source 120 and a heat dissipation layer 130.

The light sources 120 emit light towards the display panel 50. The light sources 120 may be formed as chips. In an exemplary embodiment, the light sources 120 may be, but is not limited to, light-emitting diodes (LEDs) or LED chips. The light sources 120 may emit light of a particular wavelength band. For example, the light sources 120 may emit blue light having a wavelength band of 420 nm to 470 nm. In some exemplary embodiments, the light sources 120 may emit light having two or more peak wavelengths. For example, the light sources 120 may emit light of a near ultraviolet wavelength and blue light.

In an exemplary embodiment, the light sources 120 may be disposed in the light source cells CE, respectively. In some other exemplary embodiments, a plurality of light sources 120 may be disposed in one light source cell CE, and a transistor of the circuit element layer may deliver electric signal simultaneously to the plurality of light sources 120 disposed in the light source cell CE. Each light source 120 may be disposed around the center of the light source cell CE. The area of each of light sources 120 may be smaller than the area of the respective light source cells CE when viewed from the top. The light sources 120 may be spaced apart from one another along the first and second directions X and Y at a predetermined distance.

The heat dissipation layer 130 may be disposed to surround the light sources 120. The heat dissipation layer 130 may be connected to the light sources 120 through a thermally conductive material. When the light sources 120 emit light, heat is generated. The heat can be discharged through the heat dissipation layer 130 connected to the light sources 120, which will be described in more detail later.

The light source cells CE may be arranged in a matrix on the substrate 110. The light source cells CE may be arranged along the first direction X and the second direction Y. The light source cells CE are illustrated as being arranged in parallel with the longer sides and shorter sides of the display device 1, but the inventive concepts are not limited thereto. For example, in some exemplary embodiments, the light source cells CE may be inclined with respect to the longer sides/shorter sides of the display device 1 at a certain angle. In addition, although the rows and columns of the light source cells CE are illustrated as being extended in straight lines, in some exemplary embodiments, however, the rows and columns of the light source cells CE may be arranged to be staggered.

The heat dissipation layer 130 disposed in each light source cell CE may be spaced apart from another heat dissipation layer 130 of an adjacent light source cell CE. Since the heat dissipation layer 130 is electrically connected to a first electrode 111 for driving the light source 120 as described below, the heat dissipation layer 130 in the light source cell CE is separated from another heat dissipation layer 130 of an adjacent light source cell to prevent a short-circuit between the light sources 120 of adjacent light source cells CE.

Each of the light source cells CE may have substantially a square shape when viewed from the top. The length Rx of the sides of the light source cell CE in the first direction X and the length Ry of the sides in the second direction Y may range from approximately 8 mm to 12 mm, or may be approximately 10 mm when viewed from the top, without being limited thereto.

Each of the light source cells CE may have substantially the same size. As such, spaces between the heat dissipation layers 130 of the light source cells CE may be extended in the first direction X and the second direction Y along straight lines to form a lattice, in which signal lines for driving the light sources 120 may be disposed. However, the inventive concepts are not limited thereto.

As shown in FIG. 4, the light source cell CE may include a line area PA, a circuit area CA, and a light source area LA.

The line area PA may be disposed on the left area of the light source cell CE in the first direction X. The line area PA may have substantially a rectangular shape when viewed from the top. In an exemplary embodiment, the length Ax of the side of the line area PA in the first direction X may range from approximately 2.5 mm to 6 mm, or may be approximately 4 mm when viewed from the top. The length Ay of the side of the line area PA in the second direction Y may range from approximately 8 mm to 12 mm, or may be approximately 10 mm when viewed from the top. However, the inventive concepts are not limited thereto.

The line area PA is an area, in which lines for transmitting signals to drive the light sources 120 may be arranged. For example, data lines, gate lines, etc. may be disposed in the line area PA.

The light source area LA may be disposed at the center of the light source cell CE. The light source area LA may have substantially a square shape when viewed from the top. In an exemplary embodiment, the length Bx of the sides of the light source area in the first direction X may range approximately from 1.5 mm to 2.5 mm, or may be approximately 2 mm when viewed from the top. The length By of the sides of the light source area in the second direction Y may range approximately from 1.5 mm to 2.5 mm, or may be approximately 2 mm when viewed from the top. However, the inventive concepts are not limited thereto, and in some exemplary embodiments, the light source area may have a different shape and/or a different size depending on the shape of the light source 120.

The light source area LA is an area, in which the light source 120 is disposed. In the light source area LA, a light source 120 and first and second electrodes 111 and 112 capable of transmitting a signal to the light source 120 are disposed.

The first electrode 111 and/or the second electrode 112 are disposed on the substrate 110 in the light source area LA. The area of the first electrode 111 and/or the second electrode 112 may be smaller than that of the light source area LA. In an exemplary embodiment, the first electrode 111 and/or the second electrode 112 may have substantially a rectangular shape with the sides in the first direction X being shorter the sides in the second direction Y when viewed from the top. However, the inventive concepts are not limited thereto. The first electrode 111 and the second electrode 112 are spaced apart from each other in the first direction X on the substrate 110, and may be substantially parallel with each other. However, the inventive concepts are not limited thereto. For example, in some exemplary embodiments, the first electrode 111 and/or the second electrode 112 may be spaced apart from each other in the second direction Y and be substantially parallel with each other. In this case, the first electrode 111 and/or the second electrode 112 may have substantially a rectangular shape with the sides in the first direction X longer than the sides in the second direction Y when viewed from the top.

A part of the first electrode 111 may overlap a part of the light source 120, and a part of the second electrode 112 may overlap a part of the light source 120 in the third direction Z. The light source 120 is in contact with the first electrode 111 and the second electrode 112, as they overlap each other in the third direction Z. As the first electrode 111 and the second electrode 112 are in contact with the light source 120, an electrical signal can be delivered to the light source 120. The circuit area CA is defined in the remaining area of the light source cell CE other than the line area PA and the light source area LA. The line area PA, the light source area LA, and the circuit area CA may not overlap one another.

In the circuit area CA, a circuit element layer including at least one transistor for driving the light source 120 may be disposed. For example, at least one capacitor and/or at least one transistor may be disposed in the circuit area.

The heat dissipation layer 130 may be disposed on substantially the entire surface of the light source cell CE except for the light source area LA. More particularly, the heat dissipation layer 130 may be disposed in a portion of the light source area LA. A part of the heat dissipation layer 130 may overlap a part of the first electrode 111 in the third direction Z when viewed from the top. The heat dissipation layer 130 and the first electrode 111 may be in contact with each other, as they overlap each other in the third direction Z.

The portion of the first electrode 111 that overlaps with the light source 120 in the third direction Z is spaced apart from the portion of the first electrode 111 that overlaps with the heat dissipation layer 130 in the third direction Z, such that they do not overlap each other. As the portion of the first electrode 111 that overlaps with the light source 120 is spaced apart from the portion of the first electrode 111 that overlaps with the heat dissipation layer 130, electric signals may be prevented from overlapping in the light source 120 due to the heat dissipation layer 130.

Figure 5:
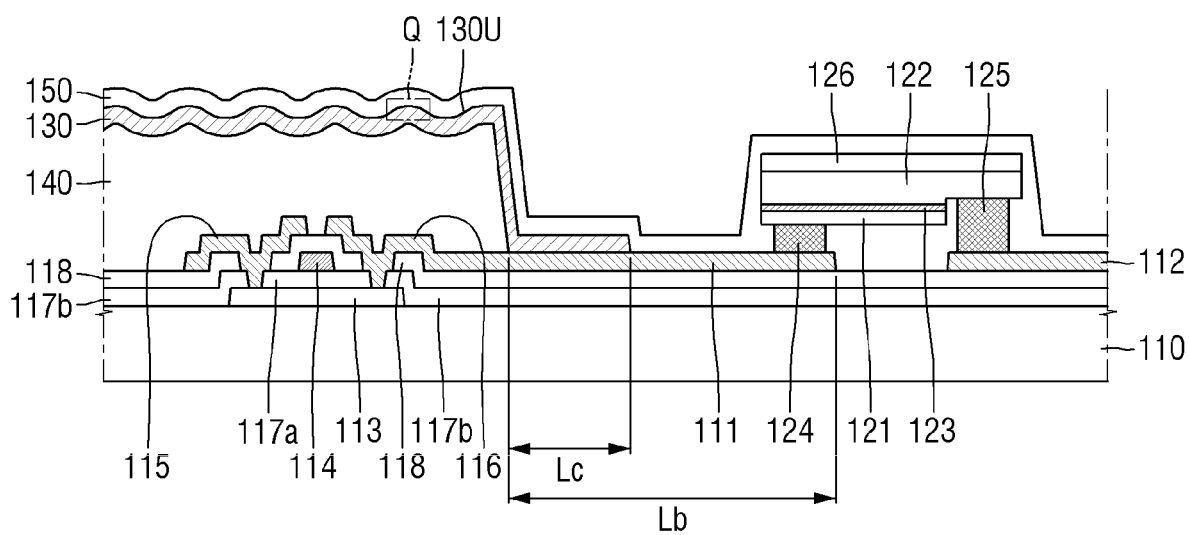
FIG. 5 is a cross-sectional view of a light source member according to an exemplary embodiment.
Figure 6:
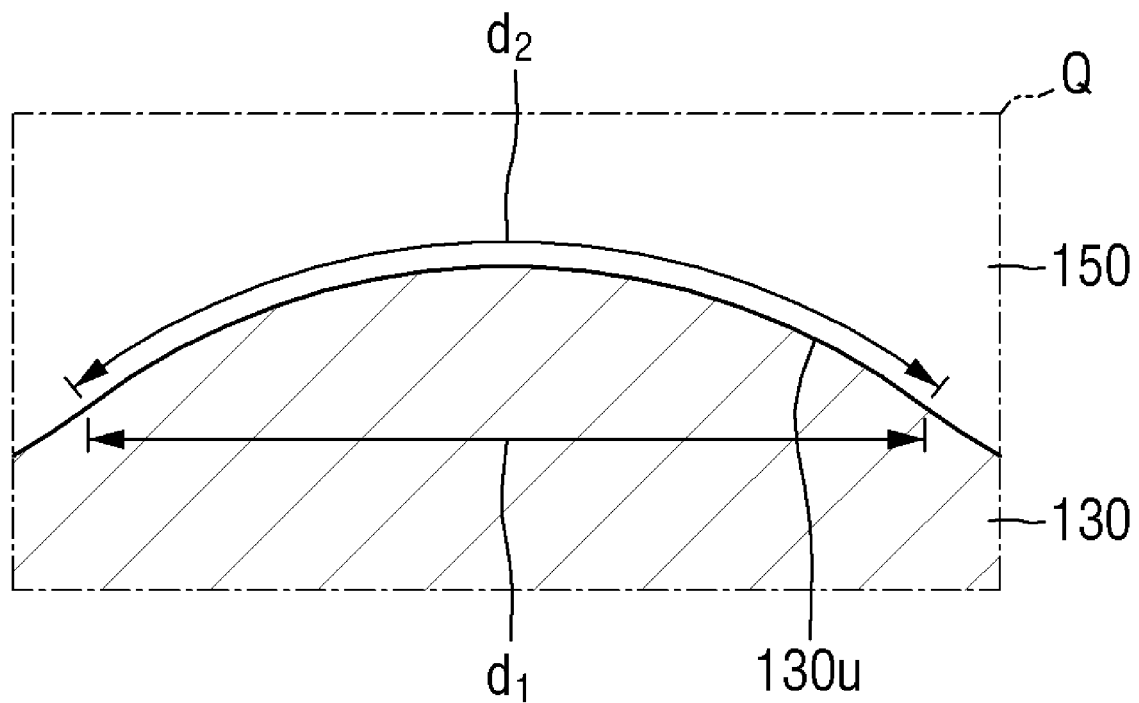
FIG. 6 is an enlarged view of a portion of the upper surface of the heat dissipation layer of FIG. 5.

FIG. 5 is a cross-sectional view of a light source member according to an exemplary embodiment. FIG. 6 is an enlarged view of a portion of the upper surface of the heat dissipation layer of FIG. 5. FIG. 5 shows a cross-sectional view taken along the line traversing a light source 120 in the light source member 100.

Referring to FIG. 5, the light source member 100 may further include a circuit element layer 110a disposed on the substrate 110. In this case, the light source 120 and the heat dissipation layer 130 may be disposed on the circuit element layer 110a.

The substrate 110 may be an insulation substrate. The substrate 110 may include a transparent material, such as glass and quartz, or may include a polymer material, such as polyimide. In another exemplary embodiment, the substrate 110 may be a circuit board, such as a printed circuit board including a circuit element layer.

The substrate 110 may have a shape that is generally similar to the display panel 50 when viewed from the top. For example, when the display panel 50 has a rectangular shape when viewed from the top, the substrate 110 may also have a similar rectangular shape when viewed from the top. Although the size of the substrate 110 may be substantially equal to the size of the display panel 50 in the plan view, however, the inventive concepts are not limited thereto.

The circuit element layer 110a is disposed on one surface of the substrate 110. The circuit element layer 110a may include a transistor, gate insulators 117a and 117b, and an interlayer insulating layer 118. The transistor includes an active layer 113, a gate electrode 114, a source electrode 115, and a drain electrode 116.

The active layer 113 of the transistor is disposed on the upper surface of the substrate 110. In some exemplary embodiments, the circuit element layer 110a may further include a buffer layer disposed between the active layer 113 of the transistor and the substrate 110. In this case, the active layer 113 may be disposed on the buffer layer. The active layer 113 may be a semiconductor layer including an oxide semiconductor, silicon, etc., without being limited thereto.

The active layer 113 may include conductive regions and a channel region. A region of the active layer 113 that overlaps with the gate electrode 114 in the third direction Z may be the channel region, and the other regions of the active layer 113 may be the conductive regions that are partially doped with impurities.

The gate insulator 117a and the gate electrode 114 are sequentially stacked on the active layer 113, so that the conductive regions located at both ends of the active layer 113 are exposed. The active layer 113 may overlap the gate electrode 114 with the gate insulator 117a therebetween to form the channel region described above. The gate insulator 117b may be disposed on substantially the entire upper surface of the substrate 110.

The interlayer insulating layer 118 may be disposed on the gate insulator 117b. The interlayer insulating layer 118 may be formed, so that the conductive regions positioned at both ends of the active layer 113 are exposed. The conductive regions of the active layer 113 exposed by the interlayer insulating layer 118 may be in contact with the source electrode 115 and the drain electrode 116, respectively. The drain electrode 116 may be extended to the exposed interlayer insulating layer 118, and may be electrically connected directly to the first electrode 111. Although the drain electrode 116 and the first electrode 111 are illustrated as a single piece in the drawings, the inventive concepts are not limited thereto. For example, in some exemplary embodiments, the drain electrode 116 may be separated from the first electrode 111, and may be and connected to the first electrode 111 via another structure.

Although the transistor is illustrated as having a top-gate structure, in which the gate electrode 114 of the transistor in the circuit element layer 110a is disposed above the active layer 113, however, the inventive concepts are not limited thereto. In addition, the circuit element layer 110a may include more members other than the elements of the transistor 113, 114, 115, and 116, the gate insulators 117a and 117b, and the interlayer insulating layer 118.

The light source 120 may be disposed on the circuit element layer 110a. As described above, the light source 120 overlaps and is in contact with a part of the first electrode 111 and the second electrode 112 of the circuit element layer 110a in the third direction Z.

The light source 120 includes a first conductivity-type semiconductor 121, a second conductivity-type semiconductor 122, an active material layer 123, a first bump 124, and a second bump 125. An electrical signal transmitted from the transistor may be transferred to the active material layer 123 by the first conductivity-type semiconductor 121 and the second conductivity-type semiconductor 122, and the active material layer 123 may emit light of a particular wavelength band.

The first conductivity-type semiconductor 121 may be a p-type semiconductor layer. For example, when the light source 120 emits light of a blue wavelength band, the first conductivity-type semiconductor 121 may be a semiconductor material having formula: $In_xAl_yGa_{(1-x-y)}N$, where $0 \leq x \leq 1$, $0 \leq y \leq 1$, and $0 \leq x+y \leq 1$. For example, the first conductivity type semiconductor 121 may be at least one of p-type doped InAlGaN, GaN, AlGaN, InGaN, AlN, and InN. The first conductivity-type semiconductor 121 may be doped with a first conductivity-type dopant. For example, the first conductivity-type dopant may be Mg, Zn, Ca, Se, and Ba, etc.

The second conductivity-type semiconductor 122 is disposed above the first conductivity-type semiconductor 121. The second conductivity-type semiconductor 122 may be an n-type semiconductor layer. For example, when the light source 120 emits light of a blue wavelength band, the first conductivity-type semiconductor 121 may be a semiconductor material having formula: $In_xAl_yGa_{(1-x-y)}N$, where $0 \leq x \leq 1$, $0 \leq y \leq 1$, and $0 \leq x+y \leq 1$. For example, the second conductivity-type semiconductor 122 may be at least one of n-type doped InAlGaN, GaN, AlGaN, InGaN, AlN, and InN. The second conductivity-type semiconductor 122 may be doped with a second conductivity-type dopant. For example, the second conductivity-type dopant may be Si, Ge, and Sn, etc.

The active material layer 123 is disposed between the first conductivity-type semiconductor 121 and the second conductivity-type semiconductor 122. The active material layer 123 may include a material having a single or multiple quantum well structure. When the active material layer 123 includes a material having the multiple quantum well structure, quantum layers and well layers may be alternately stacked therein. The active material layer 123 can emit light as electron-hole pairs are combined therein in response to an electrical signal applied through the first conductivity-type semiconductor 121 and the second conductivity-type semiconductor 122. For example, when the active material layer 123 emits light in the blue wavelength range, the active material layer 123 may include a material, such as AlGaN and AlInGaN. In particular, when the active material layer 123 has the multiple quantum well structure, in which the quantum layers and the well layers are stacked on one another alternately, the quantum layers may include AlGaN or AlInGaN, and the well layers may include materials, such as GaN or AlGaN. However, the inventive concepts are not limited thereto. For example, in some exemplary embodiments, the active material layer 123 may include other Group III to Group V semiconductor materials depending on the wavelength band of emitted light.

The light source 120 may further include the first bump 124 and the second bump 125. The light source 120 may be mounted on the circuit element layer 110a through the first bump 124 and the second bump 125.

The first bump 124 may be disposed on the lower surface of the first conductivity-type semiconductor 121. The first bump 124 may be disposed between the first conductivity-type semiconductor 121 and the first electrode 111 to bring the light source 120 into physical contact with the first electrode 111 for electrical connection. Although the first bump 124 is illustrated as being in direct contact with the first electrode 111, in some exemplary embodiments, an electrically and thermally conductive material may be additionally interposed between the first bump 124 and the first electrode 111.

The second conductivity-type semiconductor 122 may have a shape, in which at least a portion of the other surface thereof is recessed toward the inner side. The second bump 125 may be disposed under the recessed portion of the second conductivity-type semiconductor 122. The second bump 125 may be disposed between the second conductivity-type semiconductor 122 and the second electrode 112 to bring the light source 120 into physical contact with the second electrode 112 for electrical connection.

The first bump 124 and the second bump 125 may include an electrically conductive material to transmit an electrical signal transmitted from the transistor to the first conductivity-type semiconductor 121 and the second conductivity-type semiconductor 122. However, the inventive concepts are not limited thereto, and in some exemplary embodiments, the light source 120 may include additional structure.

The light source 120 may further include a base substrate 126 disposed on the second conductivity-type semiconductor 122. In an exemplary embodiment, the base substrate 126 may include a transparent substrate, such as sapphire substrate ($Al_2O_3$) and glass, without being limited thereto. For example, in some exemplary embodiments, the base substrate 126 may include a conductive substrate, such as GaN, SiC, ZnO, Si, GaP, and GaAs.

The light source member 100 may have a path for discharging heat, through which the heat generated in the light source 120 may be transferred from the first bump 124 to the first electrode 111 by being in physical contact with each other. In addition, the light source member 100 may also have a path for discharging heat, through which the heat generated in the light source 120 may be transferred from the second bump 125 to the second electrode 112 by being in physical contact with each other. The path for discharging the heat after being diffused into the first electrode 111 through the first bump 124 of the light source 120 will be described in more detail later after the structure of the heat dissipation layer 130 is described.

An organic layer 140 may be disposed on the circuit element layer 110a. The organic layer 140 may overlap the active layer 113, the gate electrode 114, the source electrode 115, and the drain electrode 116 of the transistor in the third direction Z, and may expose a part of the first electrode 111 in the third direction Z. The organic layer 140 may cover each of the active layer 113, the gate electrode 114, the source electrode 115 and the drain electrode 116 of the transistor, and may cover a part of the first electrode 111.

The organic layer 140 includes an upper surface, a lower surface, and side surfaces. The lower surface of the organic layer 140 is in contact with the circuit element layer 110a. The side surface of the organic layer 140 may be inclined to have a predetermined angle with the upper surface of the substrate 110.

The upper surface of the organic layer 140 may not be even. The upper surface of the organic layer 140 may have a concavo-convex shape. Although the organic layer 140 of the illustrated exemplary embodiment is shown as having the concavo-convex shape on the entire upper surface thereof, however, in some exemplary embodiments, only a part of the upper surface of the organic layer 140 may have the concavo-convex shape, where the heat dissipation layer 130 is disposed.

The organic layer 140 may include an organic insulating material. The thickness of the organic layer may be, but is not limited to, in a range of approximately 2.5 μm to 3.5 μm, or may be approximately 3 μm. In some exemplary embodiments, the organic layer 140 may be replaced with an inorganic insulating layer including an inorganic insulating material.

The heat dissipation layer 130 is disposed on the organic layer 140. The heat dissipation layer 130 may diffuse heat generated from the light source 120. In particular, as described above, when the substrate 110 is a glass substrate having a low thermal conductivity, the efficiency of discharging the heat generated in the light source 120 may be low. As such, the heat dissipation layer 130 may be made of a material having a high thermal conductivity to facilitate the diffusion of the heat generated from the light source 120. For example, the heat dissipation layer 130 may include metal, such as silver (Ag), copper (Cu), aluminum (Al), molybdenum (Mo), or an alloy thereof, and indium tin oxide (ITO). In some exemplary embodiments, the heat dissipation layer 130 may be formed by stacking multiple layers including the above described materials.

The heat dissipation layer 130 is disposed on the upper surface of the organic layer 140. The heat dissipation layer 130 may be disposed on the upper and side surfaces of the organic layer 140 to cover the organic layer 140. The heat dissipation layer 130 may be extended to the outer side from the side surface of the organic layer 140, so as to overlap the upper surface of the first electrode 111 and contact the first electrode 111. Accordingly, the heat dissipation layer 130 may be electrically connected to the first electrode 111 and the first bump 124 electrically connected thereto.

The heat dissipation layer 130 may be disposed conformally on the organic layer 140. As such, the surface of the heat dissipation layer 130 may have a shape similar to that of the organic layer 140. For example, when the surface of the organic layer 140 has an uneven shape, the surface of the heat dissipation layer 130 may also have the uneven shape. Alternatively, when the surface of the organic layer 140 has a flat shape, the surface of the heat dissipation layer 130 may also have the flat surface. In an exemplary embodiment, the upper surface of the organic layer 140 may have an uneven shape while the side surface of the organic layer 140 may have a flat shape. In this case, the upper surface of the heat dissipation layer 130 may have the concavo-convex pattern while the side surface of the heat dissipation layer 130 may be flat.

FIG. 6 is an enlarged view of portion Q of FIG. 5, which illustrates one of the elevations of the upper surface of the heat dissipation layer.

Referring to FIG. 6, the length d2 of a single elevation of the upper surface 130U of the heat dissipation layer 130 may be about 2.8 to about 3.1 times the length d1 of a flat surface of the heat dissipation layer 130. In an exemplary embodiment, when the surface of the heat dissipation layer 130 has the concavo-convex shape, the surface area of the concavo-convex shape may be approximately 6.1 times the surface area of the flat surface of the heat dissipation layer 130. As such, the area for discharging heat of the heat dissipation layer 130 can be increased by about 6.1 times. In this manner, when the path for discharging heat is formed as described above, the resistance of the heat generated by the light source 120 can be reduced, and thus, the discharging heat efficiency can be increased.

Referring back to FIG. 5, the heat dissipation layer 130 may be further extended toward the side surface of the organic layer 140 to cover at least a part of the first electrode 111. In an exemplary embodiment, the heat dissipation layer 130 may cover both the upper and side surfaces of the organic layer 140, and may be disposed on a part of the upper surface of the first electrode 111 while exposing at least a part of the first electrode 111.

The heat dissipation layer 130 may be physically spaced apart from the first bump 124 of the light source 120. For example, the bridge length Lb may range from approximately 1.2 mm to 1.9 mm, or may be approximately 1.55 mm, and the contact length Lc may range from approximately 0.6 mm to 0.95 mm, or may be approximately 0.7 mm, where the bridge length Lb is defined as the length of the first electrode 111 in the first direction X exposed by the organic layer 140, and the contact length Lc may be defined as the length of the region where the heat dissipation layer 130 and the first electrode 111 are in contact with each other in the first direction X.

The light source member 100 may have a path for discharging heat, through which the heat generated in the light source 120 is diffused to the heat dissipation layer 130 from the first electrode 111 by being in physical contact between a part of the first electrode 111 and the heat dissipation layer 130. More particularly, as described above, the heat generated in the light source 120 is diffused to the first electrode 111 through the first bump 124, and the heat diffused to the first electrode 111 is diffused to the heat dissipation layer 130 disposed on the organic layer 140 from the first electrode 111 through the contact area between the heat dissipation layer 130 and the first electrode 111. As such, the heat generated in the light source 120 is diffused to the heat dissipation layer 130 having a larger surface area, such that the area for discharging heat can be increased and the junction temperature of the light source 120 can be reduced. In this manner, it is possible to prevent the temperature around the light source 120 from increasing. In some exemplary embodiments, the organic layer 140 and the heat dissipation layer 130 having substantially the same structure as described above may be disposed on the second bump 125 and the second electrode 112 in contact with the second bump 125, so that an additional path for discharging heat can be created.

The light source member 100 may further include a capping layer 150. The capping layer 150 may be disposed on substantially the entire surface of the light source member 100. More particularly, the capping layer 150 may be disposed to cover the upper surface of the heat dissipation layer 130, the upper surface of the first electrode 111 exposed by the heat dissipation layer 130, the light source 120, and the upper surface of the second electrode 112.

The capping layer 150 may prevent permeation of moisture and/or oxygen (hereinafter referred to as "moisture/oxygen"). The capping layer 150 may include an inorganic insulating material, such as silicon nitride, silicon oxide, etc.

As described above, in the light source member 100 according to the illustrated exemplary embodiment, the heat dissipation layer 130 is conformally disposed on the organic layer 140 having the concavo-convex, thereby increasing the surface area of the heat dissipation layer 130. In this manner, it is possible to effectively discharge the heat generated from the light source 120.

Hereinafter, light source members according to other exemplary embodiments will be described. In the following description, the same or similar elements will be denoted by the same or similar reference numerals, and redundant descriptions will be omitted or briefly described. Descriptions will be focused on differences from the above described exemplary embodiment.

Figure 7:
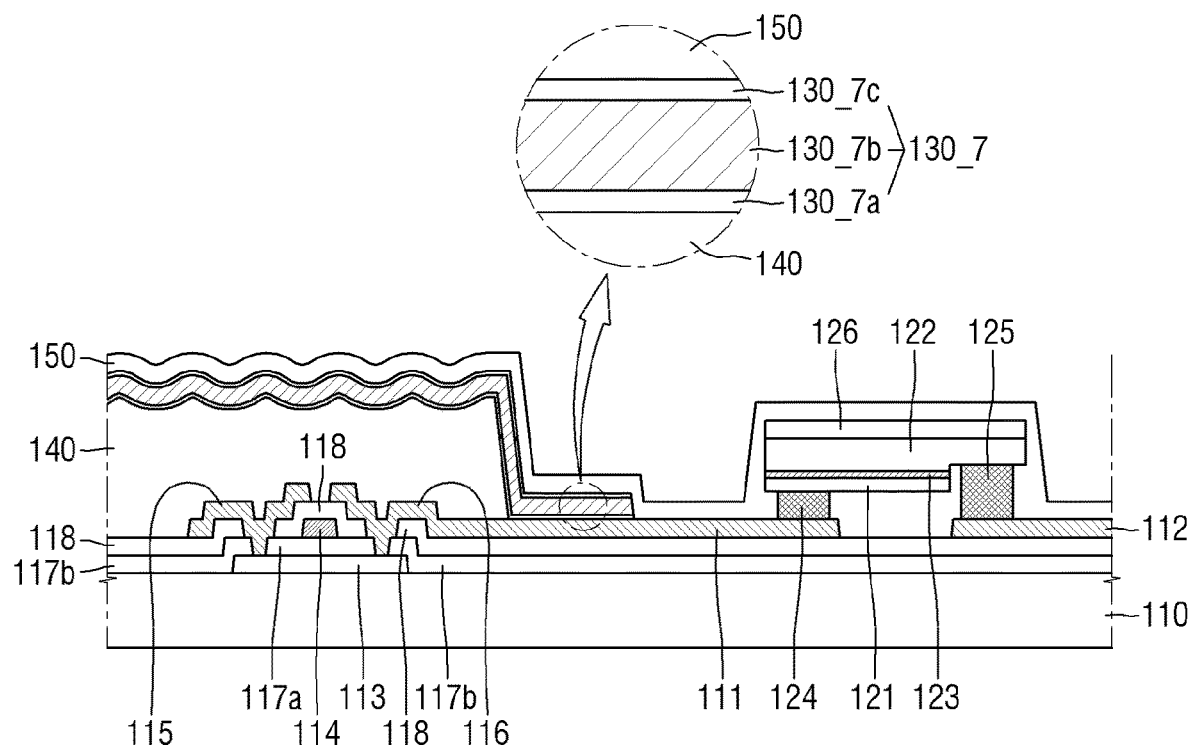
FIG. 7 is a cross-sectional view of a light source member according to another exemplary embodiment.

FIG. 7 is a cross-sectional view of a light source member according to another exemplary embodiment. FIG. 7 illustrates that a heat dissipation layer 130_7 of the light source member includes multiple films. Although the heat dissipation layer 1307 is illustrated as including triple films, the inventive concepts are not limited to a particular number of the films, and in some exemplary embodiments, the heat dissipation layer 130_7 may include double films or four or more films.

Referring to FIG. 7, the heat dissipation layer 130_7 may include a first heat dissipation film 130_7a, a second heat dissipation film 130_7b, and a third heat dissipation film 130_7c sequentially stacked one over one another in the thickness direction. The first to third heat dissipation film 130_7a, 130_7b, and 1307c may be conformally stacked and disposed on the organic layer 140, so as to have substantially the same profile as the upper and side surfaces of the organic layer 140. Side surfaces of the first to third heat dissipation films 130_7a, 130_7b, and 130_7c disposed on the upper surface of the first electrode 111 may be aligned with each other.

The first heat dissipation film 130_7a may be disposed on the organic layer 140. The first heat dissipation film 130_7a may be disposed on substantially the entire upper surface of the organic layer 140. The first heat dissipation film 130_7a disposed on substantially the entire upper surface of the organic layer 140 may be extended to cover the side surface of the organic layer 140 and a part of the upper surface of the first electrode 111. In an exemplary embodiment, the first heat dissipation film 130_7a may cover both the upper and side surfaces of the organic layer 140 and may be disposed on of the upper surface of the first electrode 111 while partially exposing a part of the first electrode 111.

The first heat dissipation film 130_7a may include a material having a high thermal conductivity. The first heat dissipation film 130_7a may be made of, for example, a material including metal, such as indium tin oxide (ITO) and indium zinc oxide (IZO), without being limited thereto.

The second heat dissipation film 130_7b may be disposed on the first heat dissipation film 130_7a. The second heat dissipation film 130_7b may be disposed on substantially the entire upper surface of the first heat dissipation film 130_7a so as to cover the first heat dissipation film 130_7a. In an exemplary embodiment, the thickness of the second heat dissipation film 130_7b may be greater than the thickness of the first heat dissipation film 130_7a.

The second heat dissipation film 130_7b may be made of a material having a high thermal conductivity. The second heat dissipation film 130_7b may be formed of, but is not limited to, a material including metal, such as silver (Ag), copper (Cu), aluminum (Al) and molybdenum (Mo), or an alloy thereof.

The third heat dissipation film 130_7c may be disposed on the second heat dissipation film 130_7b. The third heat dissipation film 130_7c may be disposed substantially on the entire upper surface of the second heat dissipation film 130_7b. In an exemplary embodiment, the thickness of the third heat dissipation film 130_7c may be less than the thickness of the second heat dissipation film 130_7b.

The third heat dissipation film 130_7c may be made of a material having a high thermal conductivity. The third heat dissipation film 130_7c may include a material that may form the first heat dissipation film 130_7a described above. The third heat dissipation film 130_7c may be made of the same material as the first heat dissipation film 130_7a, but the inventive concepts are not limited thereto.

The first heat dissipation film 130_7a and the third heat dissipation film 130_7c may be made of substantially the same material and may have substantially the same thickness. The second heat dissipation film 1307b may be made of a material different from the first heat dissipation film 130_7a and the third heat dissipation film 130_7c, and may have a thickness greater than that of the first heat dissipation film 130_7a and the third heat dissipation film 130_7c. For example, the first heat dissipation film 130_7a and the third heat dissipation film 130_7c may include indium tin oxide (ITO), and the second heat dissipation film 1307b may include aluminum (Al).

Figure 8:
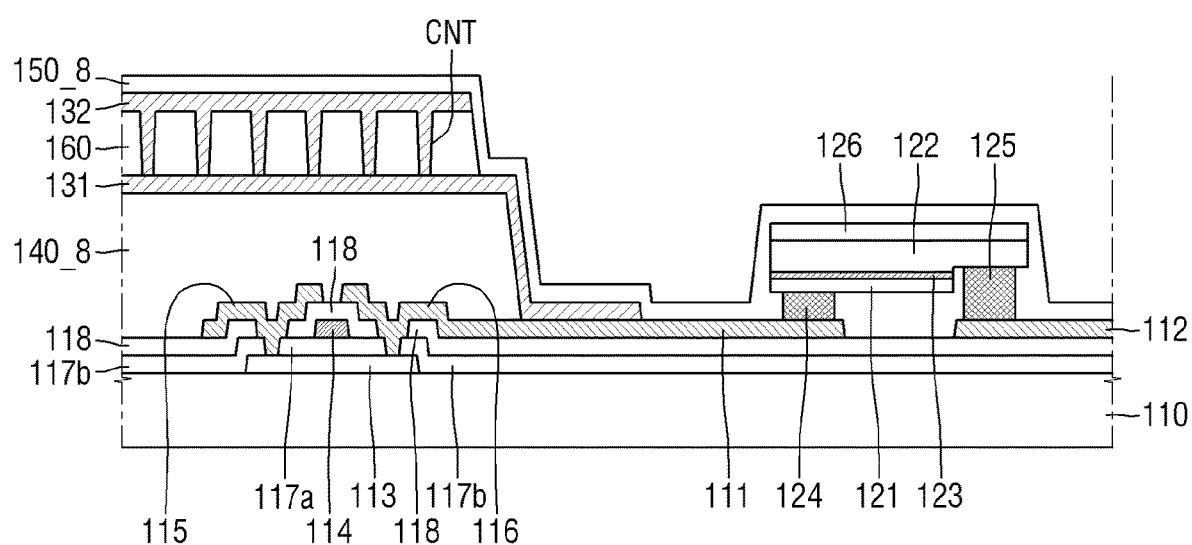
FIG. 8 is a cross-sectional view of a light source member according to yet another exemplary embodiment.

FIG. 8 is a cross-sectional view of a light source member according to yet another exemplary embodiment.

A heat dissipation layer 130_8 of the light source member according to the illustrated exemplary embodiment may include a plurality of heat dissipation layers, in which an insulating layer is interposed. Although the heat dissipation layer 130_8 is illustrated as including two heat dissipation layers 131 and 132, in some exemplary embodiments, the heat dissipation layer 130_8 may include three or more heat dissipation layers.

According to the illustrated exemplary embodiment shown in FIG. 8, the upper surface of the organic layer 140_8 may be formed flat. Although the upper surface of the organic layer 140_8 is illustrated as being entirely flat in FIG. 8, the inventive concepts are not limited thereto.

The heat dissipation layer 130_8 may include a first heat dissipation layer 131 and a second heat dissipation layer 132. The first heat dissipation layer 131 and/or the second heat dissipation layer 132 may be made of a material having a high thermal conductivity. For example, first heat dissipation layer 131 and/or the second heat dissipation layer 132 may be formed of a material including metal, such as silver (Ag), copper (Cu), aluminum (Al), molybdenum (Mo), or alloys thereof, and indium tin oxide (ITO). The first heat dissipation layer 131 and the second heat dissipation layer 132 may be made of substantially the same material, but the inventive concepts are not limited thereto.

The first heat dissipation layer 131 is disposed on the upper surface of the organic layer 140_8. The first heat dissipation layer 131 may be disposed on the upper and side surfaces of the organic layer 1408, and may cover the organic layer 1408. The first heat dissipation layer 131 may be extended from the side surface of the organic layer 1408 to overlap the upper surface of the first electrode 111 and contact the first electrode 111. Accordingly, the first heat dissipation layer 131 may be electrically connected to the first electrode 111 and the first bump 124 electrically connected thereto. In this manner, the heat generated in the light source 120 may be diffused to the first heat dissipation layer 131 disposed on the organic layer 140_8 through the first electrode 111.

The first heat dissipation layer 131 may be disposed conformally on the organic layer 140_8. As such, the surface of the first heat dissipation layer 131 may have a profile similar to that of the organic layer 140_8. For example, when the upper surface of the organic layer 140_8 is flat, the first heat dissipation layer 131 may also have a flat surface profile.

An insulating layer 160 may be disposed on the first heat dissipation layer 131. The insulating layer 160 may be in contact with the upper surface of the first heat dissipation layer 131. The insulating layer 160 may be disposed in a portion of the area, where the organic layer 140_8 and the first heat dissipation layer 131 overlap in the third direction Z. The side surface of the insulating layer 160 may be disposed inwardly with respect to the side surface of the organic layer 140_8. Accordingly, the insulating layer 160 may expose portions the first heat dissipation layer 131 disposed on the side surface of the organic layer 1408 and on the upper surface of the organic layer 140_8.

The insulating layer 160 may include at least one contact hole CNT. The contact hole CNT formed in the insulating layer 160 may pass through the insulating layer 160 in the third direction Z. The second heat dissipation layer 132, which will be described later, may be in physical contact with the upper surface of the first heat dissipation layer 131 through the contact hole CNT formed through the insulating layer 160 in the third direction Z.

The insulating layer 160 may include an insulating material. For example, the insulating layer 160 may include at least one or more insulating materials, such as silicon nitride and silicon oxide, and may have a single layer structure or a stacked structure including multiple layers.

The second heat dissipation layer 132 may be disposed on the insulating layer 160. The second heat dissipation layer 132 may be disposed on the upper surface of the insulating layer 160 to cover the upper surface of the insulating layer 160 while exposing at least one side surface of the insulating layer 160 in the third direction Z. Although the side surface of the second heat dissipation layer 132 is illustrated as being aligned with the side surface of the insulating layer 160, however, the inventive concepts are not limited thereto. For example, in some exemplary embodiments, the side surface of the second heat dissipation layer 132 may be extended to cover a part of the side surface of the insulating layer 160. The second heat dissipation layer 132 may not be in direct contact with the first electrode 111.

The light source member according to the illustrated exemplary embodiment may have the path for discharging heat, through which the heat generated in the light source 120 is diffused to the first heat dissipation layer 131, and the heat diffused to the first heat dissipation layer 131 is diffused to the second heat dissipation layer 132. More particularly, the heat generated in the light source 120 is diffused to the first heat dissipation layer 131 disposed on the organic layer 140_8 through the first electrode 111, and the heat diffused to the first heat dissipation layer 131 is diffused to the second heat dissipation layer 132 through the contact holes CNT formed in the insulating layer 160.

The heat dissipation layer 130_8 according to the illustrated exemplary embodiment is made up of double layers, so that the total surface area of the heat dissipation layer 130_8 may be increased to improve the heat discharging efficiency.

Figure 9:
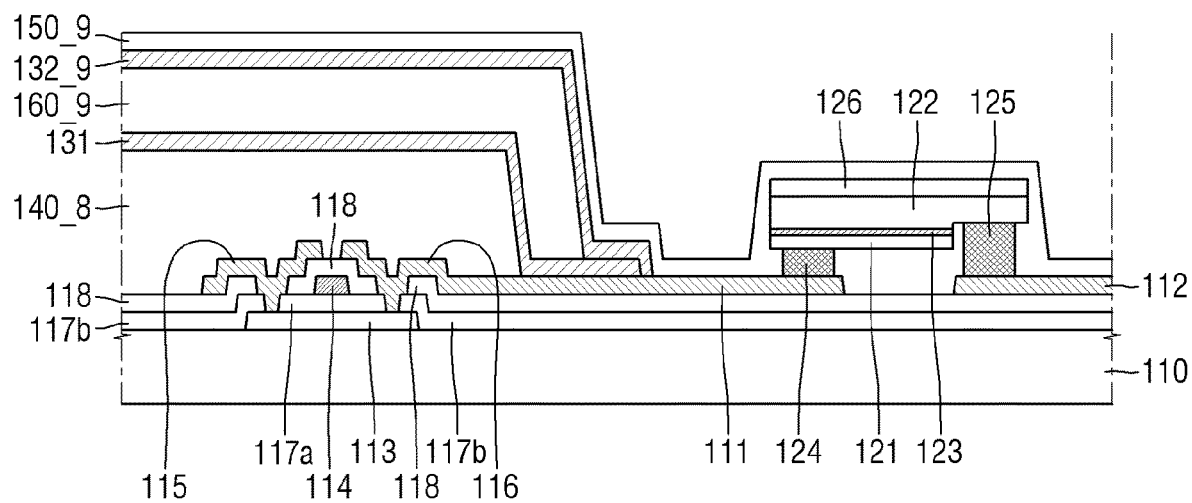
FIG. 9 is a cross-sectional view of a light source member according to yet another exemplary embodiment.

FIG. 9 is a cross-sectional view of a light source member according to yet another exemplary embodiment.

Referring to FIG. 9, an insulating layer 160_9 may be disposed on the first heat dissipation layer 131. The insulating layer 160_9 may be disposed to overlap the first heat dissipation layer 131 disposed on the upper surface of an organic layer 140_8 and on the side surface of the organic layer 140_8. The side surface of the insulating layer 160_9 may be disposed inwardly with respect to the side surface of the organic layer 1408, such that the insulating layer 160_9 may be disposed on the first heat dissipation layer 131, overlap at least a part of the area where the organic layer 140_8 and the first heat dissipation layer 131 overlap each other in the third direction Z.

A second heat dissipation layer 132_9 may be disposed on the upper surface of the insulating layer 1609. The second heat dissipation layer 1329 may be disposed on the upper and side surfaces of the insulating layer 160_9 to cover the insulating layer 160_9. The second heat dissipation layer 132_9 disposed on the insulating layer 160_9 may be extended to cover the first heat dissipation layer 131 exposed by the insulating layer 160_9. In an exemplary embodiment, the second heat dissipation layer 132_9 may cover the first heat dissipation layer 131 and extend to the outside of the first heat dissipation layer 131 to be in contact with a part of the first electrode 111. However, the inventive concepts are not limited thereto. The second heat dissipation layer 132_9 may be disposed on a part of the upper surface of the first heat dissipation layer 131 exposed by the insulating layer 160_9. In some exemplary embodiments, the second heat dissipation layer 132_9 may be disposed to cover only the first heat dissipation layer 131 exposed by the insulating layer 1609, and may not be in contact with the first electrode 111.

According to the illustrated exemplary embodiment, the heat generated in the light source 120 may be diffused to the first heat dissipation layer 131 and/or the second heat dissipation layer 132_9 in contact with the first electrode 111 through the first heat dissipation layer 131 and/or the second heat dissipation layer 1329. More particularly, the heat may be diffused to the first heat dissipation layer 131 disposed on the upper surface of the organic layer 140_8 and/or the second heat dissipation layer through the contact portion with the second heat dissipation layer 132_9. In addition, the heat may be diffused to the second heat dissipation layer 132_9 disposed on the insulating layer 160_9 and/or may be diffused to the first heat dissipation layer 131 through the contact portion with the first heat dissipation layer 131.

By disposing the first heat dissipation layer 131 and the second heat dissipation layer 132_9 in physical contact with each other on the first electrode 111, it is possible to diffuse the heat generated in the light source 120 to the two heat dissipation layers 131 and 132_9, without forming the contact holes CNT as in the exemplary embodiment of FIG. 8. Accordingly, it is possible to omit the process of forming the contact holes CNT in the insulating layer 160 for process simplification.

Figure 10:
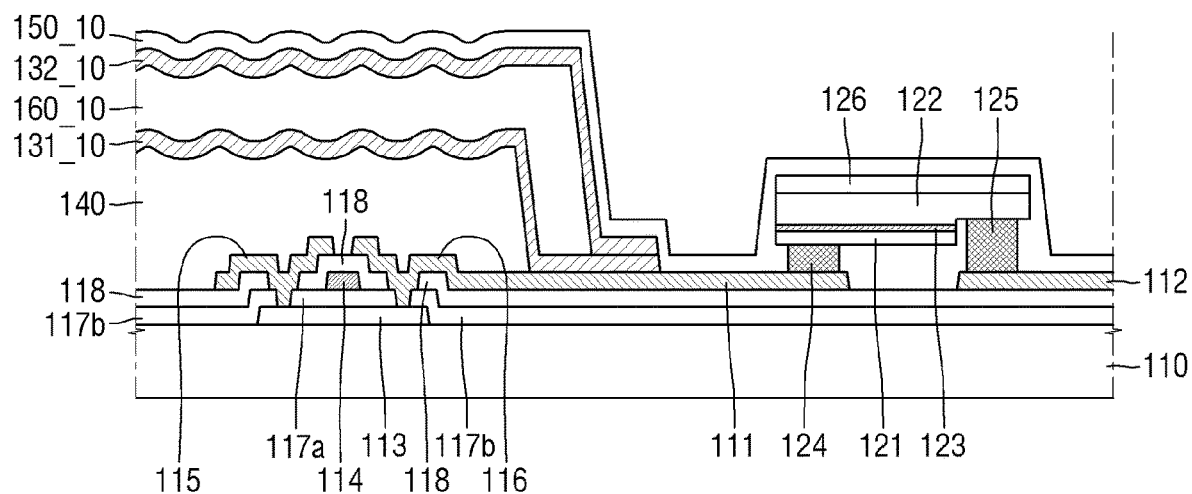
FIG. 10 is a cross-sectional view of a light source member according to yet another exemplary embodiment.

FIG. 10 is a cross-sectional view of a light source member according to yet another exemplary embodiment.

Referring to FIG. 10, a heat dissipation layer 13010 may include a plurality of heat dissipation layers 131_10 and 132_10 having concavo-convex shape. The light source member according to the illustrated exemplary embodiment is different from the light source member of FIG. 5, in that the heat dissipation layer 130_10 includes the plurality of heat dissipation layers 131_10 and 132_10. In addition, the light source member according to the illustrated exemplary embodiment is different from the light source member of FIG. 9, in that the upper and lower surfaces of the plurality of heat dissipation layers 131_10 and 132_10 have the concavo-convex Referring to FIG. 10, the heat dissipation layer 13010 may include a first heat dissipation layer 131_10 and a second heat dissipation layer 13210. From the perspective of arrangement of the elements, the heat dissipation layer 130 of FIG. 5 may be replaced with the first heat dissipation layer 131_10 in the illustrated exemplary embodiment.

An insulating layer 160_10 may be disposed on the first heat dissipation layer 131_10. The insulating layer 160_10 may be disposed to cover the first heat dissipation layer 131_10 disposed on the upper surface of an organic layer 140 and the first heat dissipation layer 131_10 disposed on the side surface of the organic layer 140. The side surface of the insulating layer 160_10 may be disposed inwardly with respect to the side surface of the organic layer 140. Accordingly, the insulating layer 160_10 may be disposed on the first heat dissipation layer 131_10, and overlap at least a part of the area where the first electrode 111 and the first heat dissipation layer 131_10 overlap each other in the third direction Z.

As described above with reference to FIG. 9, the second heat dissipation layer 132_10 may be disposed on the insulating layer 16010. The second heat dissipation layer 132_10 may be disposed on the upper and side surfaces of the insulating layer 160_10 to cover the insulating layer 16010. The second heat dissipation layer 132_10 disposed on the insulating layer 160_10 may be extended to cover the first heat dissipation layer 131_10 exposed by the insulating layer 160_10. In an exemplary embodiment, the second heat dissipation layer 132_10 may cover the first heat dissipation layer 131_10 and may not be in contact with the first electrode 111. As such, the side surface of the first heat dissipation layer 131_10 may be aligned with the side surface of the second heat dissipation layer 132_10. However, the inventive concepts are not limited thereto. For example, in some exemplary embodiments, the second heat dissipation layer 132_10 may cover the first heat dissipation layer 131_10 and may be extended to be in contact with a part of the first electrode 111.

The insulating layer 160_10 and/or the second heat dissipation layer 132_10 are conformally stacked on the first heat dissipation layer 131_10. As such, the upper and lower surfaces of the insulating layer 160_10 and the second heat dissipation layer 132_10 may have substantially the same profile as the surface of the first heat dissipation layer 131_10. According to an exemplary embodiment, the upper and lower surfaces of the first heat dissipation layer 131_10 disposed on the organic layer 140 have the concavo-convex shape, and thus, the upper and lower surfaces of the insulating layer 160_10 and the second heat dissipation layer 132_10 may also have the concavo-convex shape.

According to the illustrated exemplary embodiment, the heat dissipation layer 130_10 includes two heat dissipation layers 131_10 and 132_10, and the surfaces of the heat dissipation layers 131_10 and 132_10 have the concavo-convex shape. In this manner, the surface area of each of the heat dissipation layers 131_10 and 132_10 that has the concavo-convex shape on its surface may be approximately 6.1 times the surface area of when the respective heat dissipation layers 131_10 and 132_10 is formed flat. In addition, since there are the two heat dissipation layers 131_10 and 132_10, the area for discharging heat can be increased by approximately 12.2 times. In this manner, the resistance from the heat generated in the light source 120 can be decreased to approximately 1/12.2 (approximately 8%).

According to an exemplary embodiment, the heat generated in the light source 120 may be diffused into the first heat dissipation layer 131_10 and/or the second heat dissipation layer 132_10 through the first heat dissipation layer 131_10 in contact with the first electrode 111. More particularly, the light source member can have the path for discharging heat, through which the heat may be diffused from the first electrode 111 to the first heat dissipation layer 131_10 disposed on the upper surface of the organic layer 140 and/or to the second heat dissipation layer 132_10 through the contact portion between the first heat dissipation layer 131_10 and the second heat dissipation layer 132_10.

Figure 11:
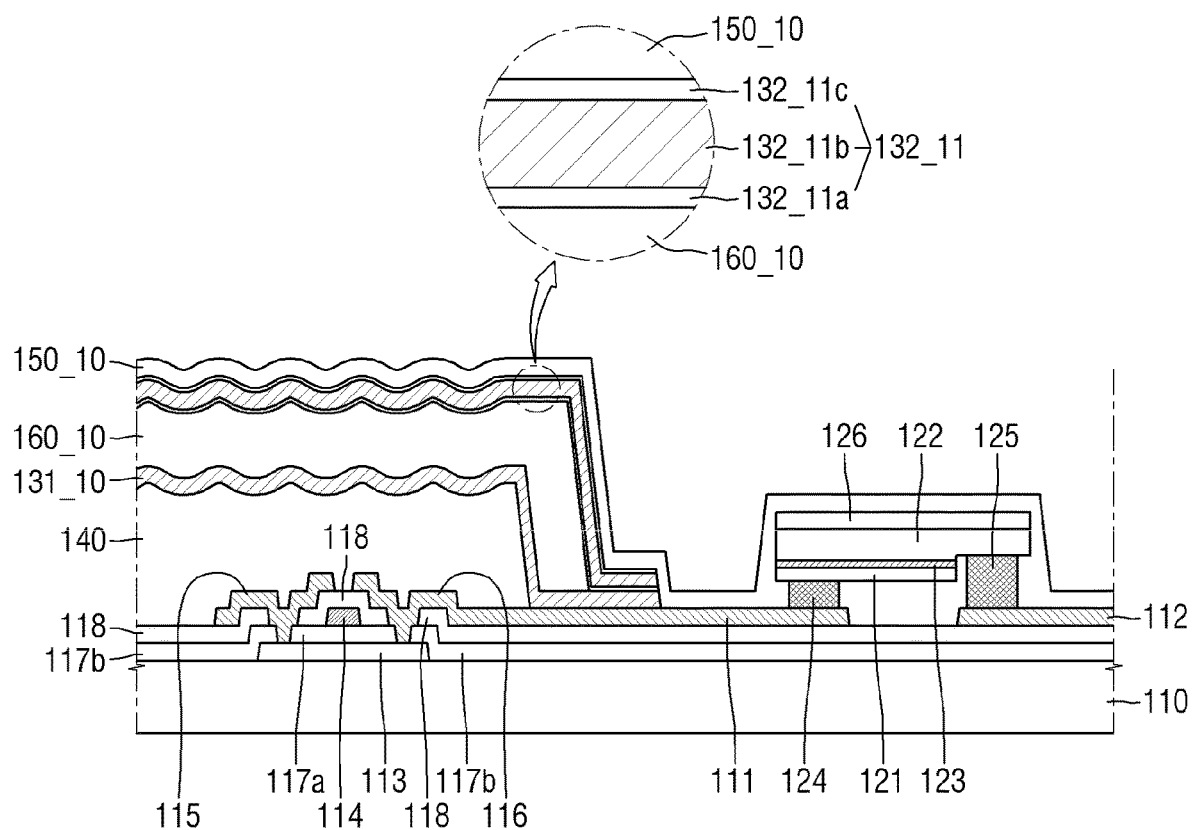
FIG. 11 is a cross-sectional view of a light source member according to yet another exemplary embodiment.

FIG. 11 is a cross-sectional view of a light source member according to yet another exemplary embodiment.

The light source member according to the illustrated exemplary embodiment of FIG. 11 is different from the light source member of FIG. 10, in that a second heat dissipation layer 13211 is made up of multiple films. Although the second heat dissipation layer 132_11 is illustrated as including triple films in FIG. 11, in some exemplary embodiments, the second heat dissipation layer 132_11 may include double films or four or more films.

Referring to FIG. 11, the second heat dissipation layer 132_11 may include a first heat dissipation film 132_11a, a second heat dissipation film 132_11b, and a third heat dissipation film 132_11c sequentially stacked one over another in the thickness direction. The first to third heat dissipation films 132_11a, 132_11b, and 132_11c may have substantially the same structure as the heat dissipation layer 130 including multiple films described above with reference to FIG. 7, and thus, repeated descriptions thereof will be omitted.

According to the illustrated exemplary embodiment, the first heat dissipation layer 131_10 includes a single film while the second heat dissipation layer 132_11 includes triple films, however, the inventive concepts are not limited thereto. For example, in some exemplary embodiments, each of the first heat dissipation layer 131_10 and the second heat dissipation layer 132_11 may include tipple or more films.

Figure 12:
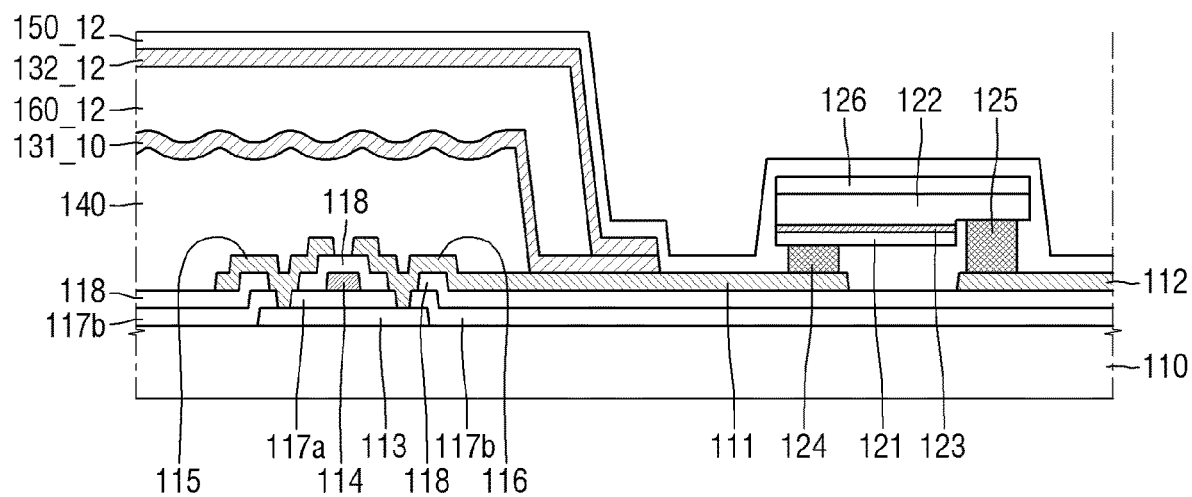
FIG. 12 is a cross-sectional view of a light source member according to yet another exemplary embodiment.

FIG. 12 is a cross-sectional view of a light source member according to yet another exemplary embodiment.

Referring to FIG. 12, the heat dissipation layer 13012 may include a plurality of heat dissipation layers 131_10 and 132_10 having different surface profiles. The light source member according to the illustrated exemplary embodiment of FIG. 12 is different from the light source member of FIG. 10, in that the second heat dissipation layer 132_12 has a flat surface profile.

As described above with reference to FIG. 10, the insulating layer 160_12 may be disposed on the upper surface of the first heat dissipation layer 131_10. The insulating layer 160_12 is disposed to overlap the organic layer 140 in the third direction Z on the first heat dissipation layer 131_10. As such, the outer side surface of the insulating layer 160_12 may protrude outward from the outer side surface of the organic layer 140.

The upper and side surfaces of the insulating layer 160_12 disposed on the first heat dissipation layer 131_10 may be generally flat. The lower surface of the insulating layer 160_12 disposed on the organic layer 140 may be formed to have substantially the same shape as the surface of the upper surface of the organic layer 140. In an exemplary embodiment, the lower and the inner side surfaces of the insulating layer 160_12 may be formed to have substantially the same profile as the surface of the first heat dissipation layer 131_10, while the upper and outer side surfaces of the insulating layer 160_12 may be formed to be flat.

The second heat dissipation layer 13212 disposed on the insulating layer 160_12 may have generally the same profile as the surface of the upper and outer side surfaces of the insulating layer 160_12. According to the exemplary embodiment, since the upper and side surfaces of the insulating layer 160_12 disposed on the first heat dissipation layer 131_10 are generally flat, the surface profile of the second heat dissipation layer 132_12 may also be generally flat.

According to the illustrated exemplary embodiment, since the surface profile of the second heat dissipation layer 132_12 is flat, the efficiency of discharging heat may be lower than that illustrated in FIG. 10, where the surface of the second heat dissipation layer 132_10 has the concavo-convex shape, because the area for discharging heat is smaller. As such, the heat dissipation layer 130_12 according to the illustrated exemplary embodiment may include a reflective material, for example, such that a part of light incident on the second heat dissipation layer 132_12 may be reflected. More particularly, the second heat dissipation layer 132_12 can reflect at least a part of light, which is emitted from the light source 120 and entered the wavelength conversion layer 200 or the diffusion plate 300 but was not transmitted therethrough to be reflected toward the second heat dissipation layer 132_12, such that the reflected light may enter the wavelength conversion layer 200 or the diffusion plate 300 again. In this manner, light may be efficiently reflected by adaptively reflecting the light. More particularly, when the second heat dissipation layer 132_12 has a flat surface profile as shown in FIG. 12, light may be regularly reflected. When the second heat dissipation layer 13210 has concavo-convex as in FIG. 10, light may be irregularly reflected.

Figure 13:
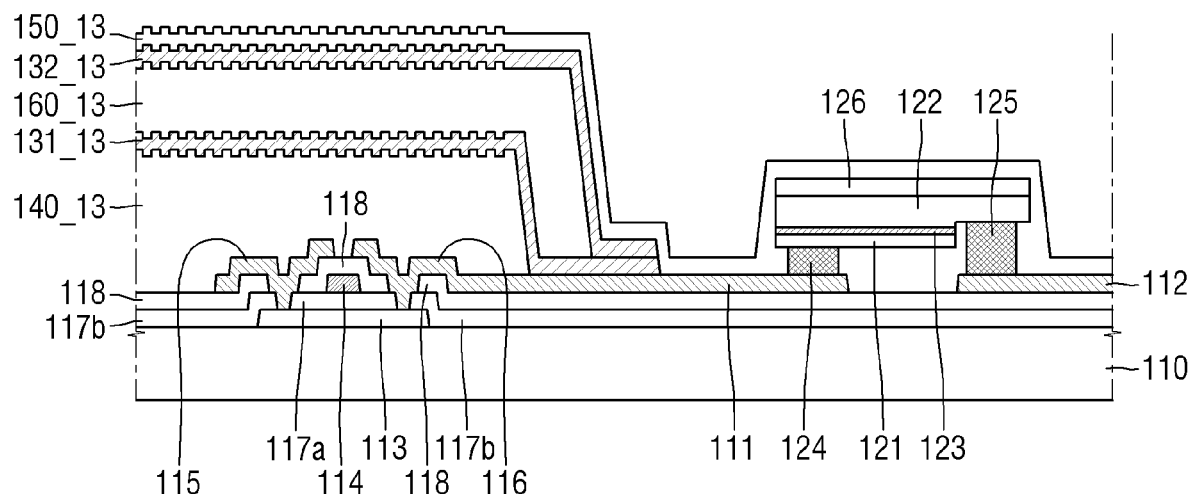
FIG. 13 is a cross-sectional view of a light source member according to yet another exemplary embodiment.

FIG. 13 is a cross-sectional view of a light source member according to yet another exemplary embodiment.

Referring to FIG. 13, a heat dissipation layer 13013 may include two heat dissipation layers 131_13 and 132_13 having projections on the surface thereof. The heat dissipation layer 130_13 according to the illustrated exemplary embodiment is different from that of FIG. 10, in that the first and second heat dissipation layers 131_13 and 132_13 have projections on the surface.

According to the illustrated exemplary embodiment, the upper surface of an organic layer 140_13 may include projections. The first heat dissipation layer 131_13, the insulating layer 160_13, and the second heat dissipation layer 13213 may be conformally stacked on the organic layer 140_13. As such, the surface of the first heat dissipation layer 131_13, the insulating layer 160_13, and the second heat dissipation layer 132_13 may have a profile similar to the surface of the organic layer 14013.

When the surface of the heat dissipation layer 130_13 includes projections, the surface area of the heat dissipation layer 130_13 can be increased to approximately 6.5 times the surface area of the heat dissipation layer 130 having a flat surface. Furthermore, when the heat dissipation layer 130_13 includes two heat dissipation layers 131_13 and 132_13 each having the projections, the area for discharging heat can be increased to approximately 13 times the area for discharging heat of the heat dissipation layer including a single heat dissipation layer having a flat surface. In this manner, the heat resistance can be reduced to approximately 1/13 (7.7%), so that the heat generated in the light source 120 can be efficiently discharged. However, the inventive concepts are not limited thereto. For example, the efficiency for discharging heat may vary depending on the size of shape of the projections formed on the heat dissipation layer 130_13.

Figure 14:
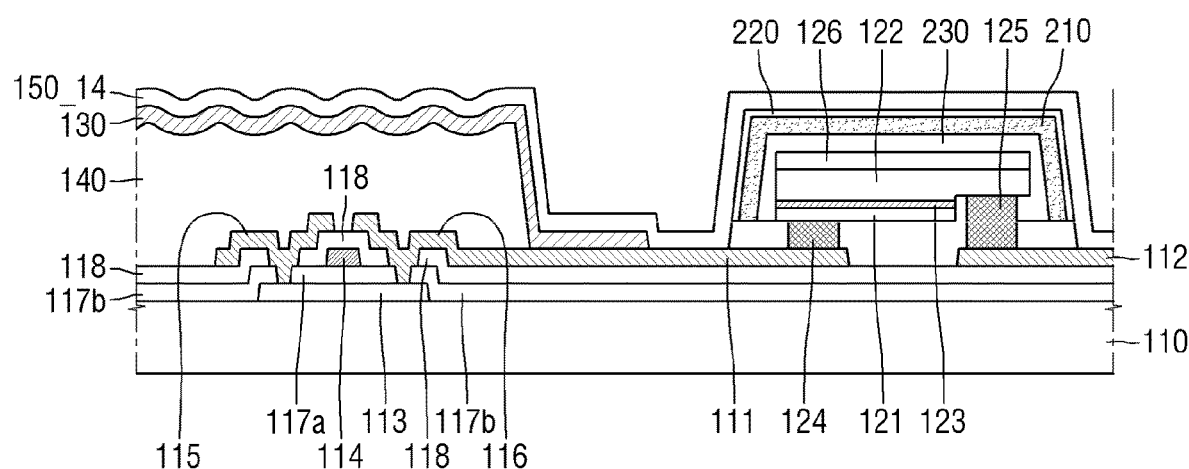
FIG. 14 is a cross-sectional view of a light source member and a wavelength conversion layer according to another exemplary embodiment.

FIG. 14 is a cross-sectional view of a light source member and a wavelength conversion layer according to another exemplary embodiment.

The light source member according to the illustrated exemplary embodiment of FIG. 14 is different from the light source member of FIGS. 1, 2, and 5, in that the wavelength conversion layer 200 is disposed only on a part of the light source member, more particularly, on the light source 120.

The wavelength conversion layer 210 according to the illustrated exemplary embodiment may be disposed on the light source 120 to surround the light source 120. The wavelength conversion layer 210 may be spaced apart from the upper surface (e.g., the upper surface of the base substrate 126) and/or side surfaces of the light source 120 to expose a part of the first bump 124 and/or the second bump 125.

By disposing the wavelength conversion layer 210 only on the light source 120, light emitted from the light source 120 can be incident onto the wavelength conversion layer 210 more efficiently. In addition, by selectively disposing the wavelength conversion layer 210 only in a region where the light source 120 is disposed, the material cost of the wavelength conversion layer 210 can be reduced.

A first protective layer 230 may be disposed between the wavelength conversion layer 210 and the light source 120 to surround the light source 120. The first protective layer 230 may be disposed on the upper and side surfaces of the light source 120 to expose a part of the first bump 124 and/or the second bump 125. The first protective layer 230 is disposed to prevent the heat generated in the light source 120 from being diffused to the wavelength conversion layer 210 that includes wavelength conversion particles, which are vulnerable to heat, thereby preventing damage to the wavelength conversion layer 210.

The first protective layer 230 may include an inorganic material. For example, the first protective layer 230 may include silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a metal thin film with light transmittance.

A second protective layer 220 may be disposed on the wavelength conversion layer 210. The second protective layer 220 is disposed on substantially the entire the upper and side surfaces of the wavelength conversion layer 210 to surround the wavelength conversion layer 210.

The second protective layer 220 may prevent permeation of moisture and/or oxygen into the wavelength conversion layer 210. The second protective layer 220 may include an inorganic material. The second protective layer 220 may include the above-listed materials that may form the first protective layer 230. In an exemplary embodiment, the second protective layer 220 may include silicon nitride.

The wavelength conversion layer 210, the first protective layer 230, and the second protective layer 220 may be integrally formed with the light source 120. For example, the wavelength conversion layer 210 may be provided in the form of a wavelength conversion coating on the first protective layer 230 disposed to surround the light source 120. The inventive concepts are not limited thereto, and the wavelength conversion layer 210 disposed on the light source 120 may be formed in other structures.

The structure of the wavelength conversion layer 210 disposed on the light source 120 is not limited to that shown in the drawing. For example, the light source 120 may be packaged on the substrate 110. In this case, the wavelength conversion layer 210 may be included in the packaged light source 120.

According to an exemplary embodiments, by forming a part of the surface of the heat dissipation layer having concavo-convex shape, the area for discharging heat can be increased to efficiently discharge heat of the light source member. In addition, by disposing a plurality of heat dissipation layers, the area for discharging heat can be increased to further increase the efficiency of discharging heat of the light source member and a backlight unit including the same.

Further, according to some exemplary embodiments, a glass substrate is employed as the substrate of the light source member, and thus, the material cost can be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light source member comprising:
    a substrate; and
    a plurality of unit light source cells disposed on the substrate and arranged in a matrix, each of the unit light source cells including:
        a first light source driving electrode and a second light source driving electrode disposed on the substrate;
        a light source disposed on the substrate and electrically connected between the first light source driving electrode and the second light source driving electrode;
        an organic layer disposed on the substrate and having an upper surface including a concavo-convex pattern that covers at least one transistor disposed on the substrate, wherein the organic layer does not cover the light source and at least a part of the first light source driving electrode; and
        a heat dissipation layer disposed on the organic layer, the heat dissipation layer directly contacting the first light source driving electrode.

2. The light source member of claim 1, wherein the heat dissipation layer is conformally disposed on the upper surface of the organic layer having the surface concavo-convex pattern.

3. The light source member of claim 1, wherein the heat dissipation layer includes at least one of silver (Ag), copper (Cu), aluminum (Al), molybdenum (Mo), and indium tin oxide (ITO), or an alloy thereof.

4. The light source member of claim 1, wherein the heat dissipation layer surrounds the light source.

5. The light source member of claim 1, wherein the heat dissipation layer is spaced apart from the light source and is electrically connected to the light source through the first light source driving electrode.

6. The light source member of claim 1, wherein the heat dissipation layer is spaced apart from a heat dissipation layer of an adjacent unit light source cell.

7. The light source member of claim 1, wherein the substrate includes glass.

8. The light source member of claim 1, wherein the first light source driving electrode and the second light source driving electrode are disposed directly on a same layer.

9. A light source member comprising:
    a substrate;
    a circuit element layer disposed on the substrate and including a first light source driving electrode and a second light source driving electrode;
    a light source disposed on the circuit element layer and electrically connected between the first light source driving electrode and the second light source driving electrode;
    a first insulating layer disposed on the circuit element layer so as to cover at least one transistor disposed on the substrate while not covering at least a part of the first light source driving electrode;
    a first heat dissipation layer disposed on the first insulating layer and directly contacting the first light source driving electrode;
    a second insulating layer disposed on the first heat dissipation layer; and
    a second heat dissipation layer disposed on the second insulating layer and directly contacting at least one of the first light source driving electrode and the first heat dissipation layer.

10. The light source member of claim 9, wherein:
    the first insulating layer includes an organic material; and
    an upper surface of the first insulating layer includes a first surface concavo-convex pattern.

11. The light source member of claim 10, wherein the first heat dissipation layer is conformally disposed on the upper surface of the first insulating layer having the first surface concavo-convex pattern to include a second surface concavo-convex pattern on one surface thereof.

12. The light source member of claim 11, wherein:
    the second insulating layer is conformally disposed on the first heat dissipation layer to include a third surface concavo-convex pattern on one surface thereof; and
    the second heat dissipation layer is conformally disposed on the second insulating layer to include a fourth surface concavo-convex pattern on one surface thereof.

13. The light source member of claim 11, wherein a surface of the second heat dissipation layer is substantially flat.

14. The light source member of claim 9, wherein each of the first heat dissipation layer and the second heat dissipation layer includes at least one of silver (Ag), copper (Cu), aluminum (Al), molybdenum (Mo), and indium tin oxide (ITO), or an alloy thereof.

15. The light source member of claim 9, wherein the first heat dissipation layer is spaced apart from the light source and is electrically connected to the light source through the first light source driving electrode.

16. The light source member of claim 9, wherein:
    the second insulating layer includes at least one contact hole penetrating through the second insulating layer; and
    the first heat dissipation layer and the second heat dissipation layer directly contact each other through the contact hole.

17. The light source member of claim 9, wherein:
    the light source member includes a plurality of unit light source cells arranged in a matrix; and
    each of the unit light source cells includes the light source, the first insulating layer, the first heat dissipation layer, the second insulating layer, and the second heat dissipation layer.

18. The light source member of claim 17, wherein:
the first heat dissipation layer is spaced apart from a first heat dissipation layer of an adjacent unit light source cell; and
the second heat dissipation layer is spaced apart from a second heat dissipation layer of the adjacent unit light source cell.

19. A display device comprising:
a light source member including a substrate and a plurality of unit light source cells arranged on the substrate in a matrix; and
a display panel disposed on the light source member,
wherein each of the unit light source cells includes:
- a circuit element layer disposed on the substrate and including a first light source driving electrode and a second light source driving electrode;
- a light source disposed on the circuit element layer and electrically connected between the first light source driving electrode and the second light source driving electrode;
- an organic layer disposed on the substrate and having an upper surface including a concavo-convex pattern that covers at east one transistor disposed on the substrate, wherein the organic layer does not cover the light source and at least a part of the first light urce driving electrode;
- a first heat dissipation layer disposed on the organic layer and directly contacting the first light source driving electrode;
- an insulating layer disposed on the first heat dissipation layer; and
- a second heat dissipation layer disposed on the insulating layer and directly contacting at least one of the first light source driving electrode and the first heat dissipation layer.

20. The display device of claim 19, wherein:
the first heat dissipation layer is conformally disposed on the organic layer to include a second surface concavo-convex pattern on one surface thereof;
the insulating layer is conformally disposed on the first heat dissipation layer to include a third surface concavo-convex pattern on one surface thereof; and
the second heat dissipation layer is conformally disposed on the insulating layer to include a fourth surface concavo-convex pattern on one surface thereof.

21. The display device of claim 19, wherein each of the first heat dissipation layer and the second heat dissipation layer includes at least one of silver (Ag), copper (Cu), aluminum (Al), molybdenum (Mo), and indium tin oxide (ITO), or an alloy thereof.

* * * * *